United States Patent
Agata

(10) Patent No.: US 11,901,419 B2
(45) Date of Patent: Feb. 13, 2024

(54) SEMICONDUCTOR DEVICE AND MANUFACTURING METHOD OF SEMICONDUCTOR DEVICE

(71) Applicant: FUJI ELECTRIC CO., LTD., Kanagawa (JP)

(72) Inventor: Yasunori Agata, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 191 days.

(21) Appl. No.: 17/486,968

(22) Filed: Sep. 28, 2021

(65) Prior Publication Data

US 2022/0013643 A1    Jan. 13, 2022

Related U.S. Application Data

(63) Continuation of application No. PCT/JP2020/034016, filed on Sep. 8, 2020.

(30) Foreign Application Priority Data

Oct. 11, 2019  (JP) .................................. 2019-187787

(51) Int. Cl.
    *H01L 29/36*    (2006.01)
    *H01L 21/263*   (2006.01)
    (Continued)

(52) U.S. Cl.
    CPC .......... *H01L 29/36* (2013.01); *H01L 21/2636* (2013.01); *H01L 21/26506* (2013.01); *H01L 29/7397* (2013.01); *H01L 29/861* (2013.01)

(58) Field of Classification Search
    CPC .......................... H01L 29/36; H01L 21/2636; H01L 21/26506
    See application file for complete search history.

(56) References Cited

U.S. PATENT DOCUMENTS

2005/0116249 A1    6/2005   Mauder
2008/0315364 A1   12/2008   Nemoto
(Continued)

FOREIGN PATENT DOCUMENTS

CN    105814694 A    7/2016
CN    106062960 A   10/2016
(Continued)

OTHER PUBLICATIONS

International Search Report and (ISA/237) Written Opinion of the International Search Authority for International Patent Application No. PCT/JP2020/034016, mailed by the Japan Patent Office dated Nov. 24, 2020.

(Continued)

*Primary Examiner* — Samuel A Gebremariam

(57) ABSTRACT

Provided is a semiconductor device which includes a semiconductor substrate that has an upper surface and a lower surface. A hydrogen chemical concentration distribution of the semiconductor substrate in a depth direction has a first hydrogen concentration peak and a second hydrogen concentration peak disposed closer to the lower surface side of the semiconductor substrate than the first hydrogen concentration peak. An intermediate donor concentration between the first hydrogen concentration peak and the second hydrogen concentration peak is different from any of an upper surface side donor concentration between the first hydrogen concentration peak and the upper surface of the semiconductor substrate and a lower surface side donor concentration between the second hydrogen concentration peak and the lower surface of the semiconductor substrate. The intermediate donor concentration may be higher than either the upper surface side donor concentration or the lower surface side donor concentration.

19 Claims, 15 Drawing Sheets

(51) Int. Cl.
  *H01L 21/265*   (2006.01)
  *H01L 29/739*   (2006.01)
  *H01L 29/861*   (2006.01)

(56) References Cited

U.S. PATENT DOCUMENTS

| | | |
|---|---|---|
| 2009/0224284 A1 | 9/2009 | Nemoto |
| 2010/0187598 A1 | 7/2010 | Endo |
| 2013/0093065 A1 | 4/2013 | Kachi |
| 2013/0249058 A1 | 9/2013 | Neidhart |
| 2014/0117502 A1 | 5/2014 | Laven |
| 2014/0246750 A1 | 9/2014 | Takishita |
| 2014/0246755 A1 | 9/2014 | Yoshimura |
| 2014/0291723 A1 | 10/2014 | Miyazaki |
| 2014/0302621 A1 | 10/2014 | Niimura |
| 2014/0357026 A1 | 12/2014 | Kobayashi |
| 2014/0374793 A1 | 12/2014 | Miyazaki |
| 2015/0024556 A1 | 1/2015 | Miyazaki |
| 2015/0050754 A1 | 2/2015 | Ploss |
| 2015/0050798 A1 | 2/2015 | Kobayashi |
| 2015/0179441 A1 | 6/2015 | Onozawa |
| 2015/0214347 A1 | 7/2015 | Falck |
| 2015/0228717 A1 | 8/2015 | Hara |
| 2015/0270132 A1 | 9/2015 | Laven |
| 2015/0311279 A1 | 10/2015 | Onozawa |
| 2015/0357229 A1 | 12/2015 | Schulze |
| 2015/0371858 A1 | 12/2015 | Laven |
| 2016/0141399 A1 | 5/2016 | Jelinek |
| 2016/0172438 A1 | 6/2016 | Jelinek |
| 2016/0276446 A1 | 9/2016 | Wakimoto |
| 2016/0276470 A1 | 9/2016 | Gouda |
| 2017/0018434 A1 | 1/2017 | Onozawa |
| 2017/0222029 A1 | 8/2017 | Kono |
| 2017/0271447 A1 | 9/2017 | Tamura |
| 2017/0373141 A1 | 12/2017 | Yoshida |
| 2018/0005829 A1 | 1/2018 | Takishita |
| 2018/0005831 A1 | 1/2018 | Schulze |
| 2018/0012762 A1 | 1/2018 | Mukai |
| 2018/0122895 A1 | 5/2018 | Jelinek |
| 2018/0166279 A1 | 6/2018 | Tamura |
| 2018/0248004 A1 | 8/2018 | Majhi |
| 2018/0350962 A1 | 12/2018 | Naito |
| 2019/0139772 A1 | 5/2019 | Kodama |
| 2021/0082702 A1 | 3/2021 | Agata |
| 2021/0104407 A1 | 4/2021 | Meguro |
| 2022/0140091 A1* | 5/2022 | Yoshimura .............. H01L 21/22 257/617 |

FOREIGN PATENT DOCUMENTS

| | | |
|---|---|---|
| CN | 107004723 A | 8/2017 |
| CN | 107408581 A | 11/2017 |
| JP | 2008091853 A | 4/2008 |
| JP | 2008227414 A | 9/2008 |
| JP | 2009188336 A | 8/2009 |
| JP | 2010147239 A | 7/2010 |
| JP | 5374883 B2 | 12/2013 |
| JP | 2015153784 A | 8/2015 |
| JP | 2016046480 A | 4/2016 |
| JP | 2017034273 A | 2/2017 |
| WO | 2007055352 A1 | 5/2007 |
| WO | 2013089256 A1 | 6/2013 |
| WO | 2013100155 A1 | 7/2013 |
| WO | 2013108911 A1 | 7/2013 |
| WO | 2013141141 A1 | 9/2013 |
| WO | 2013141221 A1 | 9/2013 |
| WO | 2013147274 A1 | 10/2013 |
| WO | 2013147275 A1 | 10/2013 |
| WO | 2014065080 A1 | 5/2014 |
| WO | 2016051973 A1 | 4/2016 |
| WO | 2016157935 A1 | 10/2016 |
| WO | 2017047285 A1 | 3/2017 |
| WO | 2017048275 A1 | 3/2017 |
| WO | 2017146148 A1 | 8/2017 |
| WO | 2018030444 A1 | 2/2018 |
| WO | 2018105299 A1 | 6/2018 |
| WO | 2020080295 A1 | 4/2020 |
| WO | 2020138218 A1 | 7/2020 |

OTHER PUBLICATIONS

International Search Report and (ISA/237) Written Opinion of the International Search Authority for International Patent Application No. PCT/JP2019/011180, mailed by the Japan Patent Office dated Jun. 4, 2019.

Office Action issued for related Chinese Application 201980004053.1, issued by The State Intellectual Property Office of People's Republic of China dated Mar. 13, 2023.

Office Action issued for related Japanese Application No. 2022-019310, issued by the Japanese Patent Office dated Mar. 28, 2023 (drafted on Mar. 27, 2023).

* cited by examiner

SEMICONDUCTOR DEVICE AND MANUFACTURING METHOD OF SEMICONDUCTOR DEVICE

The contents of the following Japanese patent applications are incorporated herein by reference:
NO. 2019-187787 filed in JP on Oct. 11, 2019, and
PCT/JP2020/034016 filed in WO on Sep. 8, 2020.

BACKGROUND

1. Technical Field

The present invention relates to a semiconductor device and a manufacturing method.

2. Related Art

Conventionally, there is known a technique in which hydrogen is implanted into a predetermined depth of a semiconductor substrate and diffused, so that lattice defects formed at the implantation depth and the diffusion region are bonded to hydrogen to form a donor, and the doping concentration can be increased (see, for example, Patent Documents 1 and 2).
Patent Document 1: Japanese Patent No. 5374883
Patent Document 2: WO 2017/47285

Problems to be Solved

It is preferable that a wide range of doping concentration can be easily adjusted in the depth direction of the semiconductor substrate.

GENERAL DISCLOSURE

In order to solve the above problem, a first aspect of the present invention provides a semiconductor device including a semiconductor substrate having an upper surface and a lower surface. The hydrogen chemical concentration distribution of the semiconductor substrate in the depth direction may have a first hydrogen concentration peak and a second hydrogen concentration peak disposed closer to the lower surface side of the semiconductor substrate than the first hydrogen concentration peak. An intermediate donor concentration between the first hydrogen concentration peak and the second hydrogen concentration peak may be different from any of an upper surface side donor concentration between the first hydrogen concentration peak and the upper surface of the semiconductor substrate and a lower surface side donor concentration between the second hydrogen concentration peak and the lower surface of the semiconductor substrate.

The intermediate donor concentration may be higher than either the upper surface side donor concentration or the lower surface side donor concentration.

The intermediate hydrogen concentration between the first hydrogen concentration peak and the second hydrogen concentration peak may be higher than any of an upper surface side hydrogen concentration between the first hydrogen concentration peak and the upper surface of the semiconductor substrate and a lower surface side hydrogen concentration between the second hydrogen concentration peak and the lower surface of the semiconductor substrate.

The intermediate donor concentration may be $1\times10^{13}/cm^3$ or more and $1\times10^{15}/cm^3$ or less.

The intermediate donor concentration may be 1.5 times or more each of the upper surface side donor concentration and the lower surface side donor concentration, respectively.

The hydrogen chemical concentration distribution may have a first upper surface side skirt in which the hydrogen concentration decreases from the first hydrogen concentration peak toward the upper surface side. The hydrogen chemical concentration distribution may have a first lower surface side skirt in which the hydrogen concentration gradually decreases from the first hydrogen concentration peak toward the lower surface side than the first upper surface side skirt. The hydrogen chemical concentration distribution may have a second lower surface side skirt in which the hydrogen concentration decreases from the second hydrogen concentration peak toward the lower surface side. The hydrogen chemical concentration distribution may have a second lower surface side skirt in which the hydrogen concentration gradually decreases from the second hydrogen concentration peak toward the upper surface side than the second lower surface side skirt.

The first hydrogen concentration peak may be higher than the second hydrogen concentration peak. The lower surface side donor concentration may be higher than the upper surface side donor concentration.

The second hydrogen concentration peak may be higher than the first hydrogen concentration peak. The upper surface side donor concentration may be higher than the lower surface side donor concentration.

The semiconductor substrate may have a drift region of a first conductivity type. The semiconductor substrate may have a trench portion provided on the upper surface of the semiconductor substrate. The semiconductor substrate may include a buffer region of a first conductivity type provided between the drift region and the lower surface of the semiconductor substrate and having a higher concentration than the drift region. The first hydrogen concentration peak and the second hydrogen concentration peak may be disposed between the lower end of the trench portion and the upper end of the buffer region in the depth direction. The intermediate donor concentration between the first hydrogen concentration peak and the second hydrogen concentration peak may be lower than any of the upper surface side donor concentration between the first hydrogen concentration peak and the upper surface of the semiconductor substrate and the lower surface side donor concentration between the second hydrogen concentration peak and the lower surface of the semiconductor substrate.

Both the first hydrogen concentration peak and the second hydrogen concentration peak may be disposed between the center of the semiconductor substrate in the depth direction and the upper surface.

The intermediate hydrogen concentration may be 10 times or more the intermediate donor concentration.

Both the lower surface side donor concentration and the upper surface side donor concentration may be higher than the bulk donor concentration of the semiconductor substrate.

A donor concentration distribution of the semiconductor substrate in the depth direction may have a flat portion both between the first hydrogen concentration peak and the upper surface of the semiconductor substrate and between the second hydrogen concentration peak and the lower surface of the semiconductor substrate.

The donor concentration distribution of the semiconductor substrate in the depth direction may have a flat portion between the first hydrogen concentration peak and the second hydrogen concentration peak.

The distance between the first hydrogen concentration peak and the second hydrogen concentration peak in the depth direction may be ½ or less of the thickness of the semiconductor substrate in the depth direction.

A second aspect of the present invention provides a manufacturing method of a semiconductor device. The manufacturing method may include implanting hydrogen ions from one of the upper surface and the lower surface of the semiconductor substrate to a first depth position, and implanting hydrogen ions from the other one of the upper surface and the lower surface of the semiconductor substrate to a second depth position different from the first depth position. The manufacturing method may include performing heat treatment on the semiconductor substrate.

The second depth position may be disposed between the first depth position and the one surface.

The second depth position may be disposed between the first depth position and the other surface. The semiconductor substrate may have a drift region of a first conductivity type. The semiconductor substrate may have a trench portion provided in the upper surface of the semiconductor substrate. The semiconductor substrate may include a buffer region of a first conductivity type provided between the drift region and the lower surface of the semiconductor substrate and having a higher concentration than the drift region. The first depth position and the second depth position may be disposed between the lower end of the trench portion and the upper end of the buffer region in the depth direction.

The manufacturing method may include performing laser annealing on at least one of the upper surface and the lower surface of the semiconductor substrate. The hydrogen implanting may be performed after the laser annealing.

Note that the above summary of the invention does not enumerate all the necessary features of the present invention. Further, a sub-combination of these feature groups can also be an invention.

DESCRIPTION OF EXEMPLARY EMBODIMENTS

Figure 1:
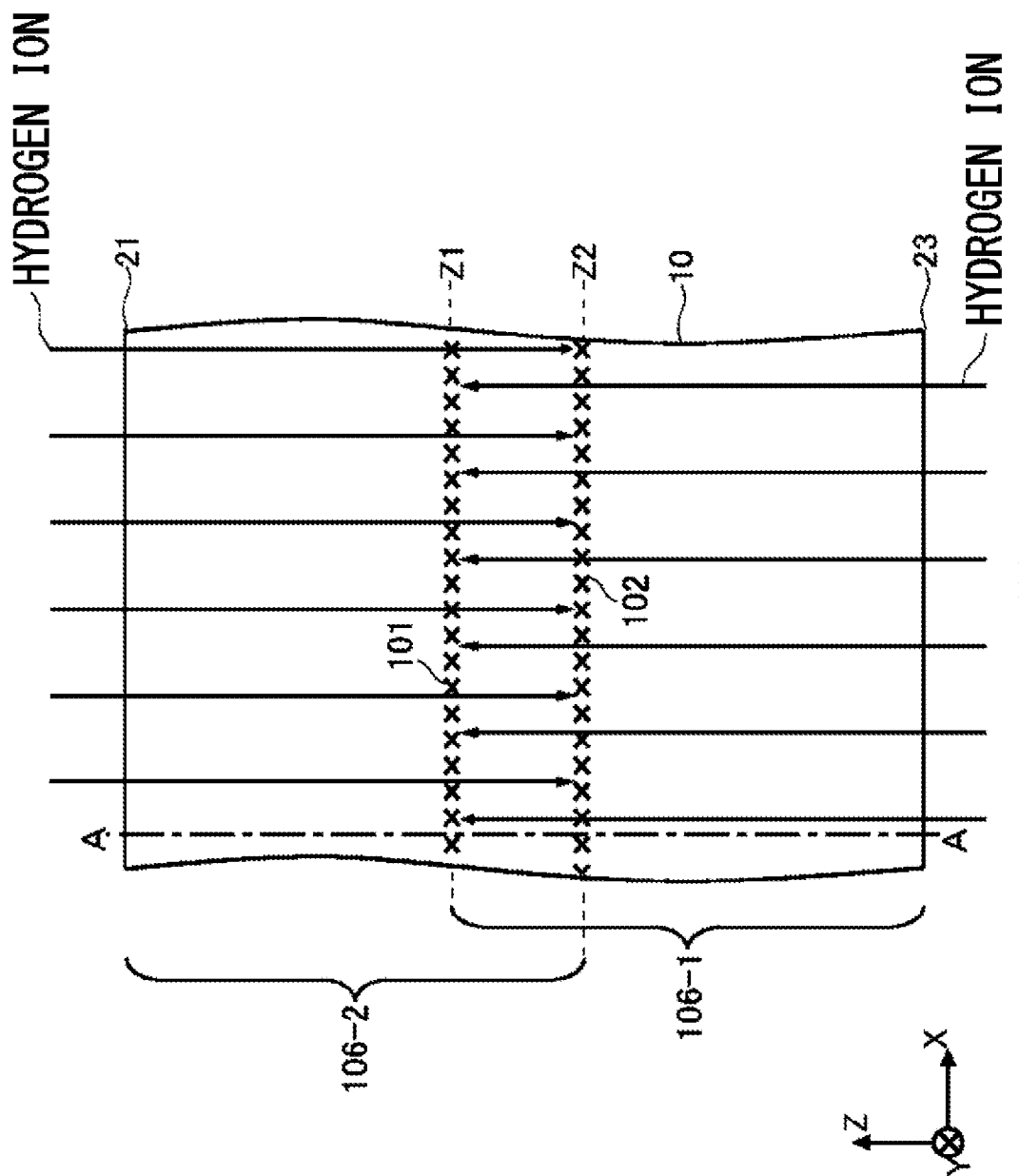
FIG. 1 is a cross-sectional view illustrating an example of a semiconductor device 100.

Hereinafter, the present invention will be described through embodiments of the invention, but the following embodiments do not limit the invention according to the claims. In addition, not all combinations of features described in the embodiments are essential to the solution of the invention.

In the present specification, one side in a direction parallel to the depth direction of a semiconductor substrate is referred to as "upper", and the other side is referred to as "lower". One of two main surfaces of a substrate, a layer, or another member is referred to as an upper surface, and the other surface is referred to as a lower surface. The "upper" and "lower" directions are not limited to the gravity direction or the direction at the time of mounting the semiconductor device.

In the present specification, technical matters may be described using orthogonal coordinate axes of an X axis, a Y axis, and a Z axis. The orthogonal coordinate axes merely identify relative positions of the components, and do not limit a specific direction. For example, the Z axis does not limit the height direction with respect to the ground. A +Z axis direction and a −Z axis direction are opposite to each other. When the Z axis direction is described without describing the sign, it means that the direction is parallel to the +Z axis and the −Z axis.

In the present specification, the orthogonal axes parallel to the upper surface and the lower surface of the semiconductor substrate are referred to as the X axis and the Y axis. In addition, the axis perpendicular to the upper surface and the lower surface of the semiconductor substrate is referred to as the Z axis. In the present specification, the direction of the Z axis may be referred to as the depth direction. In addition, in the present specification, a direction parallel to the upper surface and the lower surface of the semiconductor substrate, including the X axis and the Y axis, may be referred to as a horizontal direction.

In the present specification, the term "same" or "equal" may include a case where there is an error due to manufacturing variation or the like. The corresponding error is within, for example, 10%.

In the present specification, the conductivity type of a doping region doped with impurities is described as a P type or an N type. In the present specification, the impurities may particularly mean any of an N type donor and a P type acceptor, and it may be described as a dopant. In the present specification, doping means that a donor or an acceptor is introduced to the semiconductor substrate to form a semiconductor having an N type conductivity or a semiconductor having a P type conductivity.

In the present specification, a doping concentration means the concentration of a donor or the concentration of an acceptor in a thermal equilibrium state. In the present specification, a net doping concentration means a net concentration obtained by adding the donor concentration as the concentration of positive ions to the acceptor concentration as the concentration of negative ions, including the polarities of charges. As an example, when the donor concentration is $N_D$ and the acceptor concentration is $N_A$, the net doping concentration at an arbitrary position becomes $N_D-N_A$. In the present specification, the net doping concentration may be simply described as a doping concentration.

The donor has a function of supplying electrons to the semiconductor. The acceptor has a function of accepting electrons from the semiconductor. The donor and the acceptor are not limited to impurities themselves. For example, a VOH defect caused by a combination of a vacancy (V), an oxygen (O), and a hydrogen (H) existing in the semiconductor serves as a donor to supply electrons. In the present specification, the VOH defect may be called as a hydrogen donor.

In the present specification, the term P+ type or N+ type means that the doping concentration is higher than that of the P type or N type, and the term P− type or N− type means that the doping concentration is lower than that of the P type or N type. In addition, in the present specification, the term P++ type or N++ type means that the doping concentration is higher than that of the P+ type or N+ type.

A chemical concentration in the present specification indicates the atomic concentration of impurities, which is measured regardless of the state of electrical activation. The chemical concentration can be measured by, for example, secondary ion mass spectrometry (SIMS). The above-mentioned net doping concentration can be measured by a capacity-voltage method (CV method). In addition, a carrier concentration measured by a spreading resistance method (SR method) may be used as the net doping concentration. The carrier concentration measured by the CV method or the SR method may be a value in a thermal equilibrium state. In addition, since the donor concentration is sufficiently larger than the acceptor concentration in the N type region, the carrier concentration in the corresponding region may be used as the donor concentration. Similarly, the carrier concentration in the corresponding region in the P type region may be used as the acceptor concentration. In the present specification, the doping concentration of the N type region may be called a donor concentration, and the doping concentration of the P type region may be called an acceptor concentration.

In addition, in a case where the concentration distribution of the donor, the acceptor, or the net doping has a peak, the corresponding peak value may be used as the concentration of the donor, the acceptor, or the net doping in the corresponding region. In a case where the concentration of the donor, the acceptor, or the net doping is substantially uniform or the like, an average value of the concentration of the donor, the acceptor, or the net doping in the corresponding region may be used as the concentration of the donor, the acceptor, or the net doping.

The carrier concentration measured by the SR method may be lower than the concentration of the donor or the acceptor. In a range where the current flows when measuring a spreading resistance, there is a case where the carrier mobility of the semiconductor substrate is lower than the value of the crystal state. The decrease in carrier mobility occurs by disorder of the crystal structure caused by a lattice defect or the like to make the carrier scatter.

The concentration of the donor or the acceptor calculated from the carrier concentration measured by the CV method or the SR method may be lower than the chemical concentration of the element indicating the donor or the acceptor. As an example, the donor concentration of phosphorus or arsenic as a donor, or the acceptor concentration of boron as an acceptor in a silicon semiconductor is about 99% of its chemical concentration. On the other hand, the donor concentration of hydrogen as a donor in the silicon semiconductor is about 0.1% to 10% of the chemical concentration of hydrogen.

FIG. 1 is a cross-sectional view illustrating an example of a semiconductor device 100. The semiconductor device 100 includes a semiconductor substrate 10. The semiconductor substrate 10 is a substrate formed of a semiconductor material. As an example, the semiconductor substrate 10 is a silicon substrate.

At least one of a transistor device such as an insulated gate bipolar transistor (IGBT) and a diode device such as a freewheeling diode (FWD) is formed on the semiconductor substrate 10. In FIG. 1, the respective electrodes of the transistor device and the diode device, and the respective regions provided in the semiconductor substrate 10 are omitted. Configuration examples of the transistor device and the diode device will be described later.

In the semiconductor substrate 10 of this example, N type bulk donors are distributed throughout. The bulk donor is a dopant donor substantially uniformly contained in an ingot during the production of the ingot from which the semiconductor substrate 10 is based. The bulk donor of this example is an element other than hydrogen. The dopant of the bulk donor is, for example, phosphorus, antimony, arsenic, selenium, or sulfur, but the invention is not limited to these. The bulk donor of this example is phosphorus. The bulk donor is also contained in the P type region. The semiconductor substrate 10 may be a wafer cut out of a semiconductor ingot, or may be a chip obtained by cutting a wafer into individual pieces. The semiconductor ingot may be manufactured by either a Chokralsky method (CZ method), a magnetic field applied Chokralsky method (MCZ method), or a float zone method (FZ method). The ingot in this example is manufactured by the MCZ method. As the bulk donor concentration, the chemical concentration of the bulk donor distributed throughout the semiconductor substrate 10 may be used, or a value between 90% and 100% of the chemical concentration may be used.

The semiconductor substrate 10 has an upper surface 21 and a lower surface 23. The upper surface 21 and the lower surface 23 are two main surfaces of the semiconductor substrate 10. In the present specification, an orthogonal axis in a plane parallel to the upper surface 21 and the lower surface 23 is defined as an X axis and a Y axis, and an axis perpendicular to the upper surface 21 and the lower surface 23 is defined as a Z axis.

Hydrogen ions are implanted into the semiconductor substrate 10 from the lower surface 23 to the depth position Z1. Hydrogen ions are implanted into the semiconductor substrate 10 from the upper surface 21 to the depth position Z2. Implanting hydrogen ions into a predetermined depth position means that hydrogen ions are implanted by being accelerated with acceleration energy corresponding to the depth position. The hydrogen ions are distributed not only at the depth position but also in the vicinity of the depth position. In addition, the hydrogen ions can also be distributed in the pass-through region 106 between the implantation surface and the depth position.

The hydrogen chemical concentration distribution of the semiconductor substrate 10 in the depth direction has a first hydrogen concentration peak 101 at the depth position Z1 and a second hydrogen concentration peak 102 at the depth position Z2. In FIG. 1, the hydrogen concentration peak is schematically indicated by a cross mark. In FIG. 1, the depth position Z1 is disposed between the upper surface 21 and the depth position Z2, but the depth position Z1 may be disposed between the lower surface 23 and the depth position Z2.

In the present specification, a region through which the implanted hydrogen ions have passed may be referred to as a pass-through region. In the pass-through region 106-1 between the lower surface 23 and the depth position Z1 and the pass-through region 106-2 between the upper surface 21 and the depth position Z2, lattice defects mainly composed of vacancies such as monoatomic vacancies (V) and divacancies (VV) are formed by the passage of hydrogen. Atoms adjacent to the vacancies have dangling bonds. The lattice defect also includes inter-lattice atoms, dislocates, or the like, and in a broader way donors and acceptors can also be included. However, in the present specification, the lattice defect mainly composed of vacancies may be called a vacancy lattice defect, a vacancy defect, or simply a lattice defect. In addition, since a large number of lattice defects are formed due to the implantation of hydrogen ions into the semiconductor substrate 10, the crystallinity of the semiconductor substrate 10 may be strongly disturbed. In the present specification, the crystallinity disturbance may be called a disorder.

In addition, oxygen is contained in the entire semiconductor substrate 10. The oxygen is introduced intentionally or unintentionally at the time of manufacturing a semiconductor ingot. In the semiconductor substrate 10, a hydrogen (H), a hole (V), and an oxygen (O) are bonded to form a VOH defect. In addition, the heat treatment of the semiconductor substrate 10 diffuses hydrogen to promote the formation of VOH defects. The VOH defect serves as a donor that supplies electrons. In the present specification, the VOH defect may be simply called a hydrogen donor. In the semiconductor substrate 10 of this example, hydrogen donors are formed in the pass-through region 106 of hydrogen ions. The doping concentration of the hydrogen donor is lower than the chemical concentration of hydrogen. If the ratio of the doping concentration of the hydrogen donor to the chemical concentration of hydrogen is an activation rate, the activation rate may be a value of 0.1% to 30%. In this example, the activation rate is 1% to 5%.

By forming a hydrogen donor in the pass-through region 106 of the semiconductor substrate 10, the donor concentration in the pass-through region 106 of the semiconductor substrate 10 can be made higher than the bulk donor concentration. Usually, it is necessary to prepare the semiconductor substrate 10 having a predetermined bulk donor concentration in accordance with characteristics of an element to be formed in the semiconductor substrate 10, particularly a rated voltage or a withstand voltage. On the other hand, according to the semiconductor device 100 illustrated in FIG. 1, the donor concentration of a predetermined region of the semiconductor substrate 10 can be adjusted by controlling the dosage and implantation depth of hydrogen ions. Therefore, the semiconductor device 100 can be manufactured using a semiconductor substrate having a bulk donor concentration that does not correspond to the characteristics and the like of the element. The variation in the bulk donor concentration at the time of manufacturing the semiconductor substrate 10 is relatively large, but the dosage of hydrogen ions can be controlled with relatively high accuracy. Therefore, the concentration of lattice defects generated by implanting hydrogen ions can also be controlled with high accuracy, and the donor concentration of the pass-through region 106 can be controlled with high accuracy.

In the semiconductor device 100, hydrogen ions are implanted from both the upper surface 21 and the lower surface 23. Therefore, the pass-through region 106 having a wide range can be easily formed. In the example of FIG. 1, since the pass-through region 106-1 and the pass-through region 106-2 partially overlap, the pass-through region 106 can be formed over the entire depth direction. In addition, it is also conceivable to form a pass-through region in the entire semiconductor substrate by implanting hydrogen ions so as to penetrate the semiconductor substrate 10 from one of the upper surface 21 and the lower surface 23. On the other hand, according to the semiconductor device 100, since hydrogen ions are implanted from both the upper surface 21 and the lower surface 23, acceleration energy of hydrogen ions can be reduced as compared with a case where hydrogen ions penetrate the semiconductor substrate 10. Therefore, damage to the element structure such as a gate insulating film and the like can be reduced.

Figure 2:
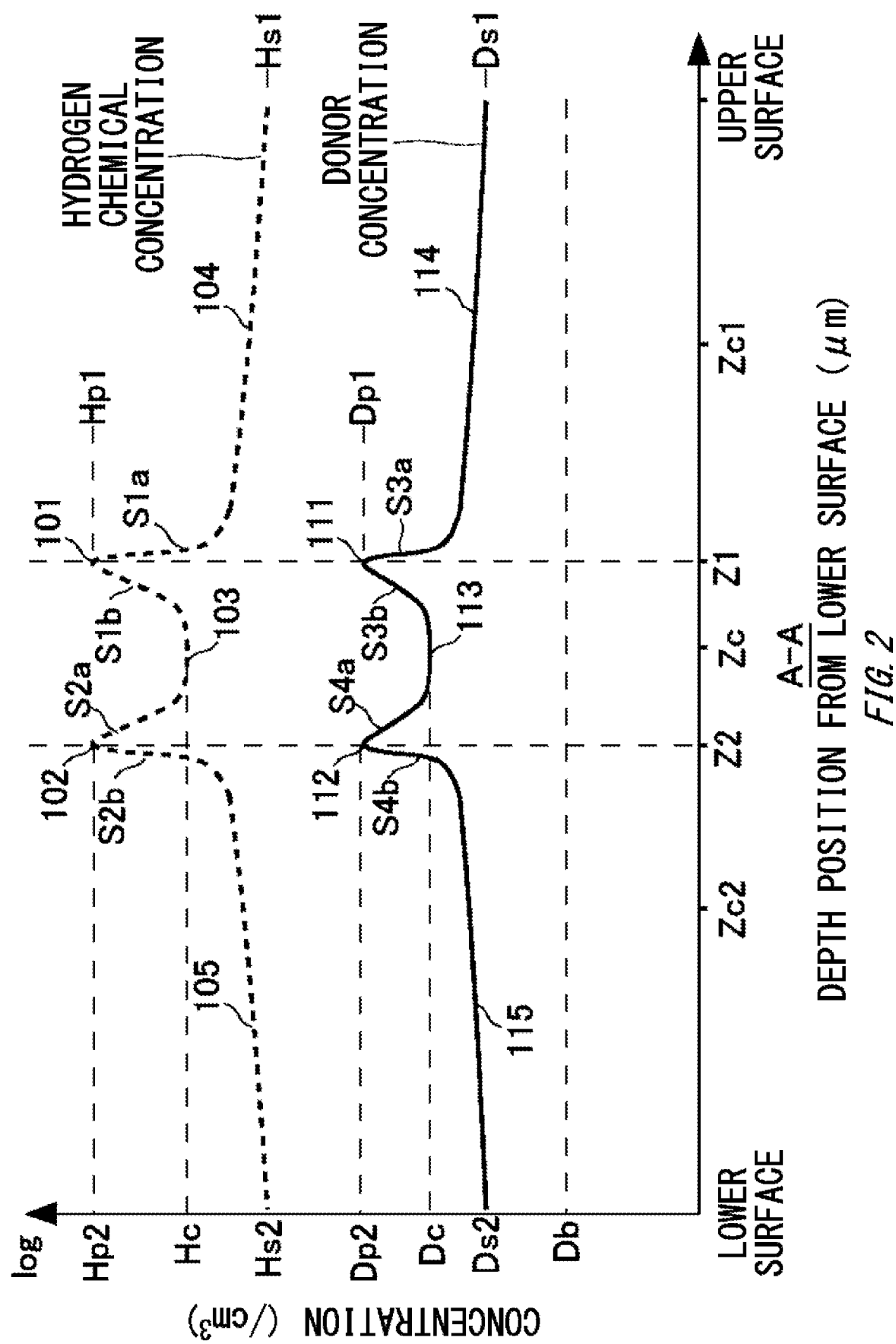
FIG. 2 illustrates a hydrogen chemical concentration distribution and a donor concentration distribution in a depth direction at a position indicated by line A-A in FIG. 1.

FIG. 2 illustrates a hydrogen chemical concentration distribution and a donor concentration distribution in the depth direction at a position indicated by line A-A in FIG. 1. In FIG. 2, the horizontal axis represents the depth position from the lower surface 23, and the vertical axis represents the hydrogen chemical concentration and the donor concentration per unit volume on a logarithmic axis. The donor concentration in FIG. 2 is measured by, for example, the CV method or the SR method. The hydrogen chemical concentration in FIG. 2 is, for example, a hydrogen concentration measured by the SIMS method. In FIG. 2, the hydrogen chemical concentration distribution is indicated by a broken line, and the donor concentration distribution is indicated by a solid line. In FIG. 2, the bulk donor concentration is denoted by Db. Further, the center position of the semiconductor substrate 10 in the depth direction is defined as Zc.

The hydrogen chemical concentration distribution has the first hydrogen concentration peak 101 and the second hydrogen concentration peak 102. The second hydrogen concentration peak 102 is disposed closer to the lower surface 23 side of semiconductor substrate 10 than the first hydrogen concentration peak 101. That is, the second hydrogen concentration peak 102 is disposed between the first hydrogen concentration peak 101 and the lower surface 23.

A position of the first hydrogen concentration peak 101 in the depth direction is defined as Z1, and a position of the second hydrogen concentration peak 102 in the depth direction is defined as Z2. The position of the concentration peak is a position where the concentration becomes a local maximum.

The hydrogen chemical concentration distribution has a first upper surface side skirt S1a, a first lower surface side skirt S1b, a second upper surface side skirt S2a, and a second lower surface side skirt S2b. The first upper surface side skirt S1a is a portion where the hydrogen concentration decreases from the first hydrogen concentration peak 101 toward the upper surface 21 side in the hydrogen chemical concentration distribution. The first lower surface side skirt S1b is a portion where the hydrogen concentration decreases from the first hydrogen concentration peak 101 toward the lower surface 23 side in the hydrogen chemical concentration distribution. The second upper surface side skirt S2$a$ is a portion where the hydrogen concentration decreases from the second hydrogen concentration peak 102 toward the upper surface 21 side in the hydrogen chemical concentration distribution. The second lower surface side skirt S2$b$ is a portion where the hydrogen concentration decreases from the second hydrogen concentration peak 102 toward the lower surface 23 side in the hydrogen chemical concentration distribution.

The first hydrogen concentration peak 101 in this example is a concentration peak due to hydrogen implanted from the lower surface 23 side. When hydrogen is implanted from the lower surface 23 side, hydrogen is also distributed in the pass-through region between the lower surface 23 and the implantation position of hydrogen. Therefore, the hydrogen concentration of the first lower surface side skirt S1$b$ more gradually decreases than the hydrogen concentration of the first upper surface side skirt S1$a$. That is, the inclination of the first lower surface side skirt S1$b$ is smaller than the inclination of the first upper surface side skirt S1$a$.

The second hydrogen concentration peak 102 in this example is a concentration peak due to hydrogen implanted from the upper surface 21 side. When hydrogen is implanted from the upper surface 21 side, hydrogen is also distributed in the pass-through region between the upper surface 21 and the implantation position of hydrogen. Therefore, the hydrogen concentration of the second upper surface side skirt S2$a$ more gradually decreases than the hydrogen concentration of the second lower surface side skirt S2$b$. That is, the inclination of the second upper surface side skirt S2$a$ is smaller than the inclination of the second lower surface side skirt S2$b$. As the inclination of the skirt of the concentration distribution in the present specification, the inclination of the skirt within a predetermined distance from the position of the concentration peak may be used. The predetermined distance may be 5 μm, 3 μm, or 1 μm. The predetermined distance may be half or ¼ of the distance between the depth position Z1 and the depth position Z2. The inclination of each skirt may be the inclination of the skirt from the position of the concentration peak to the position where the concentration value becomes half of the peak value.

The hydrogen concentration distribution between the first hydrogen concentration peak 101 and the second hydrogen concentration peak 102 is defined as an intermediate hydrogen distribution 103. The hydrogen chemical concentration of the intermediate hydrogen distribution 103 is defined as an intermediate hydrogen concentration Hc. As the intermediate hydrogen concentration Hc, a minimum value of the hydrogen concentration between the depth positions Z1 and Z2 may be used, or an average value may be used. As the intermediate hydrogen concentration Hc, an average concentration of flat portions in the intermediate hydrogen distribution 103 may be used. The flat portion in the concentration distribution is a portion where a region having a substantially constant concentration is continuous for a predetermined length in the depth direction. Details of the flat portion will be described later.

The hydrogen concentration distribution between the first hydrogen concentration peak 101 and the upper surface 21 of the semiconductor substrate 10 is defined as an upper surface side hydrogen distribution 104. The hydrogen concentration in the upper surface side hydrogen distribution 104 is defined as an upper surface side hydrogen concentration Hs1. As the upper surface side hydrogen concentration Hs1, a minimum value of the hydrogen concentration between the depth position Z1 and the upper surface 21 may be used, or an average value may be used. As the upper surface side hydrogen concentration Hs1, an average concentration of flat portions closest to the depth position Z1 among the flat portions in the upper surface side hydrogen distribution 104 may be used.

The hydrogen concentration distribution between the second hydrogen concentration peak 102 and the lower surface 23 of the semiconductor substrate 10 is defined as a lower surface side hydrogen distribution 105. The hydrogen concentration of the lower surface side hydrogen distribution 105 is defined as a lower surface side hydrogen concentration Hs2. As the lower surface side hydrogen concentration Hs2, a minimum value of the hydrogen concentration between the depth position Z2 and the lower surface 23 may be used, or an average value may be used. As the lower surface side hydrogen concentration Hs2, an average concentration of flat portions closest to the depth position Z2 among the flat portions in the lower surface side hydrogen distribution 105 may be used.

The intermediate hydrogen concentration Hc is different from any of the upper surface side hydrogen concentration Hs1 and the lower surface side hydrogen concentration Hs2. In this example, both hydrogen implanted from the upper surface 21 side and hydrogen implanted from the lower surface 23 side exist in a region between the depth positions Z1 and Z2. Therefore, the intermediate hydrogen concentration Hc in this example is higher than any of the upper surface side hydrogen concentration Hs1 and the lower surface side hydrogen concentration Hs2. The intermediate hydrogen concentration Hc may be 1.5 times or more, 2 times or more, or 5 times or more than any of the upper surface side hydrogen concentration Hs1 and the lower surface side hydrogen concentration Hs2.

The donor concentration distribution has a first donor concentration peak 111 and a second donor concentration peak 112. The second donor concentration peak 112 is disposed closer to the lower surface 23 side of the semiconductor substrate 10 than the first donor concentration peak 111. The first donor concentration peak 111 is disposed at the same depth position Z1 as the first hydrogen concentration peak 101. The second donor concentration peak 112 is disposed at the same depth position Z2 as the second hydrogen concentration peak 102. When the range of the half width of one peak includes the vertex of the other peak, it may be also said that two peaks are disposed at the same depth position.

The donor concentration distribution has a third upper surface side skirt S3$a$, a third lower surface side skirt S3$b$, a fourth upper surface side skirt S4$a$, and a fourth lower surface side skirt S4$b$. The third upper surface side skirt S3$a$ is a portion where the donor concentration decreases from the first donor concentration peak 111 toward the upper surface 21 side in the donor concentration distribution. The third lower surface side skirt S3$b$ is a portion where the donor concentration decreases from the first donor concentration peak 111 toward the lower surface 23 side in the donor concentration distribution. The fourth upper surface side skirt S4$a$ is a portion where the donor concentration decreases from the second donor concentration peak 112 toward the upper surface 21 side in the donor concentration distribution. The fourth lower surface side skirt S4$b$ is a portion where the donor concentration decreases from the second donor concentration peak 112 toward the lower surface 23 side in the donor concentration distribution.

Each donor concentration peak has a shape similar to the corresponding hydrogen concentration peak. In this example, the donor concentration of the third lower surface side skirt S3$b$ more gradually decreases than the donor concentration of the third upper surface side skirt S3$a$. That is, the inclination of the third lower surface side skirt S3$b$ is smaller than the inclination of the third upper surface side skirt S3$a$. In addition, the donor concentration of the fourth upper surface side skirt S4$a$ more gradually decreases than the donor concentration of the fourth lower surface side skirt S4$b$. That is, the inclination of the fourth upper surface side skirt S4$a$ is smaller than the inclination of the fourth lower surface side skirt S4$b$.

The donor concentration distribution between the first donor concentration peak 111 and the second donor concentration peak 112 is defined as an intermediate donor distribution 113. The donor concentration of the intermediate donor distribution 113 is defined as an intermediate donor concentration Dc. As the intermediate donor concentration Dc, a minimum value of the donor concentration between the depth positions Z1 and Z2 may be used, or an average value may be used. As the intermediate donor concentration Dc, an average concentration of flat portions in the intermediate donor distribution 113 may be used.

The donor concentration distribution between the first donor concentration peak 111 and the upper surface 21 of the semiconductor substrate 10 is defined as an upper surface side donor distribution 114. In addition, the donor concentration of the upper surface side donor distribution 114 is defined as an upper surface side donor concentration Ds1. As the upper surface side donor concentration Ds1, a minimum value of the donor concentration between the depth position Z1 and the upper surface 21 may be used, or an average value may be used. As the upper surface side donor concentration Ds1, an average concentration of flat portions closest to the depth position Z1 among the flat portions in the upper surface side donor distribution 114 may be used.

The donor concentration distribution between the second donor concentration peak 112 and the lower surface 23 of the semiconductor substrate 10 is defined as a lower surface side donor distribution 115. The donor concentration of the lower surface side donor distribution 115 is defined as a lower surface side donor concentration Ds2. As the lower surface side donor concentration Ds2, a minimum value of the donor concentration between the depth position Z2 and the lower surface 23 may be used, or an average value may be used. As the lower surface side donor concentration Ds2, the average concentration of the flat portions closest to the depth position Z2 among the flat portions in the lower surface side donor distribution 115 may be used.

The intermediate donor concentration Dc is different from any of the upper surface side donor concentration Ds1 and the lower surface side donor concentration Ds2. In this example, the intermediate donor concentration Dc is higher than any of the upper surface side donor concentration Ds1 and the lower surface side donor concentration Ds2. The intermediate donor concentration Dc may be 1.5 times or more, 2 times or more, or 5 times or more than any of the upper surface side donor concentration Ds1 and the lower surface side donor concentration Ds2.

In this example, all of the intermediate donor concentration Dc, the upper surface side donor concentration Ds1, and the lower surface side donor concentration Ds2 are higher than the bulk donor concentration Db. The intermediate donor concentration Dc may be $1 \times 10^{13}/cm^3$ or more and $1 \times 10^{15}/cm^3$ or less. The intermediate donor concentration Dc may be $5 \times 10^{13}/cm^3$ or more, or $1 \times 10^{14}/cm^3$ or more. The intermediate hydrogen concentration Hc may be 10 times or more, 50 times or more, or 100 times or more the intermediate donor concentration Dc.

As illustrated in FIG. 1, by implanting hydrogen ions so that the pass-through region 106-1 and the pass-through region 106-2 overlap, the donor concentration can be adjusted over the entire semiconductor substrate 10 in the depth direction. In addition, since hydrogen ions are implanted from both the upper surface 21 and the lower surface 23, damage to the insulating film and the like can be reduced. Further, since the depth positions Z1 and Z2 are made different from each other, it is possible to suppress the peak values of the hydrogen chemical concentration and the donor concentration from becoming too large.

A hydrogen chemical concentration Hp1 at the first hydrogen concentration peak 101 and a hydrogen chemical concentration Hp2 at the second hydrogen concentration peak 102 may be the same or different. A donor concentration Dp1 of the first donor concentration peak 111 and a donor concentration Dp2 of the second donor concentration peak 112 may be the same or different.

In the example of FIG. 2, the depth position Z1 is disposed on the upper surface 21 side of the semiconductor substrate 10. Further, the depth position Z2 is disposed on the lower surface 23 side of the semiconductor substrate 10. The upper surface 21 side refers to a region between the center Zc of the semiconductor substrate 10 in the depth direction and the upper surface 21. The lower surface 23 side refers to a region between the center Zc of the semiconductor substrate 10 in the depth direction and the lower surface 23. Further, the center position of the region on the lower surface 23 side of the semiconductor substrate 10 in the depth direction is defined as Zc2. Similarly, the center position of the region on the upper surface 21 side in the depth direction is defined as Zc1. The depth position Z1 in this example is disposed between the depth positions Zc and Zc1. The depth position Z2 is disposed between the depth positions Zc and Zc2. However, the arrangement of the depth positions Z1 and Z2 is not limited to the example of FIG. 2.

Figure 3:
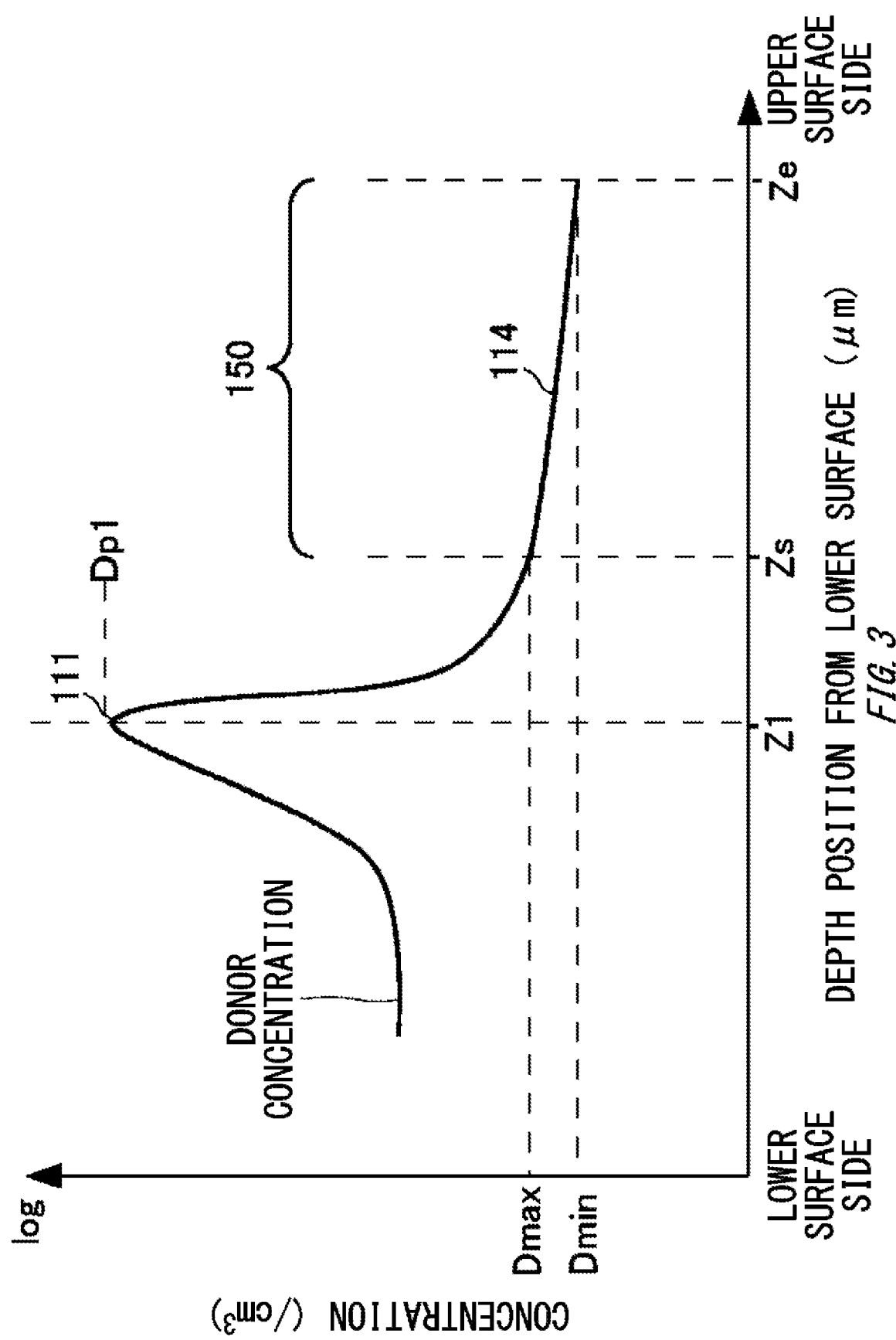
FIG. 3 is a diagram for explaining a flat portion 150 in a concentration distribution.

FIG. 3 is a diagram for explaining the flat portion 150 in the concentration distribution. In FIG. 3, the flat portion 150 in the donor concentration distribution will be described, but the same definition may be used for the flat portion in the hydrogen chemical concentration distribution. In FIG. 3, part of the first donor concentration peak 111 and the upper surface side donor distribution 114 are enlarged.

In the pass-through region 106 (see FIG. 1) through which hydrogen ions have passed, it is considered that vacancies (V, VV, etc) generated by passing of hydrogen are distributed at substantially uniform concentration in the depth direction except for the vicinity of the depth positions Z1 and Z2. In addition, oxygen (O) implanted at the time of manufacturing the semiconductor substrate 10 or the like is also considered to have uniform distribution in the depth direction. In addition, since hydrogen at each hydrogen concentration peak diffuses, a sufficient amount of hydrogen exists in the pass-through region 106. Therefore, VOH defects formed by the vacancies, oxygen, and hydrogen exist substantially uniformly in the pass-through region 106.

Therefore, in the pass-through region 106 other than the vicinity of the depth positions Z1 and Z2, there is a flat portion 150 in which VOH defects serving as donors are substantially uniformly distributed. The donor concentration in the flat portion 150 is substantially constant in the depth direction. The state in which the donor concentration is substantially constant in the depth direction may refer to, for example, a state in which a region where the difference between a maximum value Dmax and a minimum value Dmin of the donor concentration is within 50% of the maximum value Dmax of the donor concentration is continuous over a predetermined length or more in the depth direction. The difference may be 30% or less or 10% or less of the maximum value Dmax of the donor concentration of the region.

Alternatively, with respect to the average concentration of the donor concentration distribution in a predetermined range in the depth direction, the value of the donor concentration distribution may be within ±50%, within ±30%, or within ±10% of the average concentration of the donor concentration distribution. The predetermined length in the depth direction may be 5 µm, 10 µm, or 15 µm. In the example of FIG. 3, when a section defined by the two depth positions Zs and Ze is 5 µm or more, and the difference between the maximum value Dmax and the minimum value Dmin of the donor concentration of the section is within 50% of the maximum value Dmax of the donor concentration, the section is set as the flat portion 150.

In FIG. 3, the flat portion 150 of the upper surface side donor distribution 114 has been described. The flat portion 150 may be disposed in the lower surface side donor distribution 115 and may be disposed in both the upper surface side donor distribution 114 and the lower surface side donor distribution 115. The flat portion 150 may be disposed in the intermediate donor distribution 113.

Figure 4:
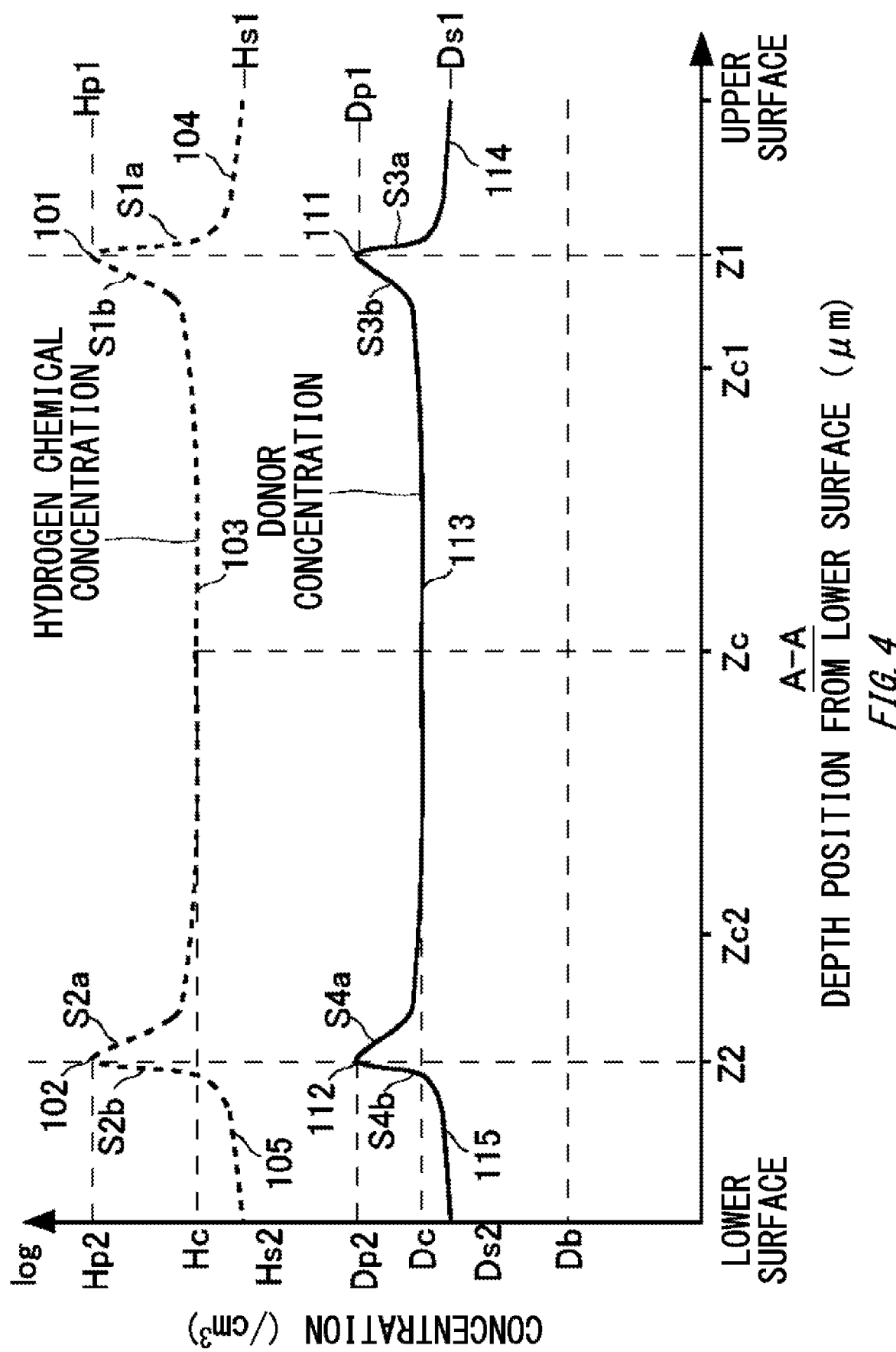
FIG. 4 illustrates another example of the hydrogen chemical concentration distribution and the donor concentration distribution in the depth direction at the position indicated by line A-A in FIG. 1.

FIG. 4 illustrates another example of the hydrogen chemical concentration distribution and the donor concentration distribution in the depth direction at the position indicated by line A-A in FIG. 1. In this example, the depth position Z1 is disposed between the depth position Zc1 and the upper surface 21, and the depth position Z2 is disposed between the depth position Zc2 and the lower surface 23. That is, the first hydrogen concentration peak 101 and the first donor concentration peak 111 are disposed between the depth position Zc1 and the upper surface 21, and the second hydrogen concentration peak 102 and the second donor concentration peak 112 are disposed between the depth position Zc2 and the lower surface 23. Other configurations are the same as those of the example illustrated in FIG. 2.

According to this example, the regions of the intermediate hydrogen distribution 103 and the intermediate donor distribution 113 can be widely formed. That is, a region having a relatively high donor concentration can be widely formed in the depth direction. In addition, it is easy to cause the first donor concentration peak 111 to serve as at least a part of the N type region formed on the upper surface 21 side of the semiconductor substrate 10 and to cause the second donor concentration peak 112 to serve as at least a part of the N type region formed on the lower surface 23 side of the semiconductor substrate 10. The N type region on the upper surface 21 side is, for example, an accumulation region to be described later. The N type region on the lower surface 23 side is, for example, a buffer region to be described later. As a result, it is possible to prevent an unnecessary donor concentration peak from being formed while forming a donor having a higher concentration than the bulk donor concentration Db over the entire semiconductor substrate 10 in the depth direction.

Figure 5:
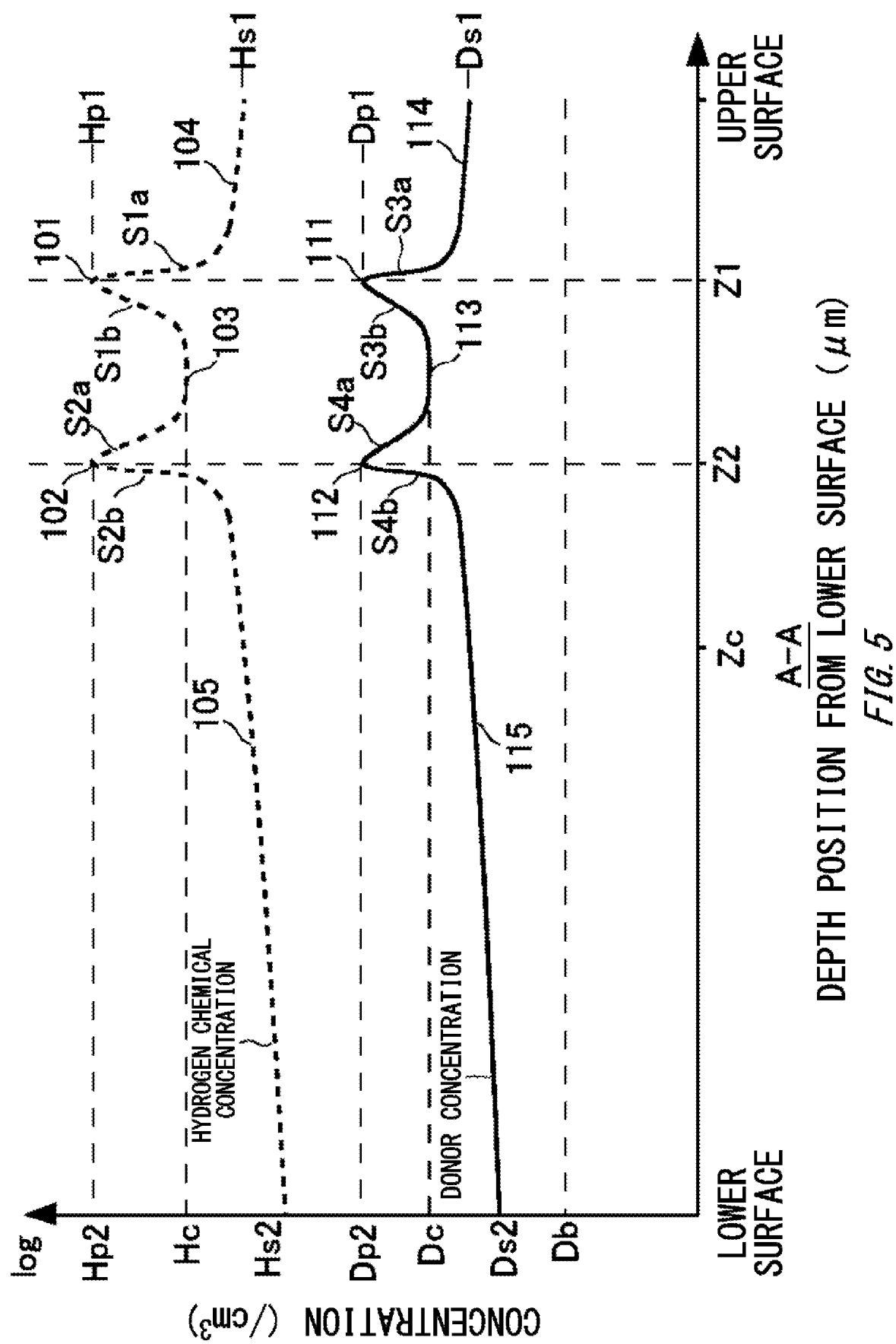
FIG. 5 illustrates another example of the hydrogen chemical concentration distribution and the donor concentration distribution in the depth direction at the position indicated by line A-A in FIG. 1.

FIG. 5 illustrates another example of the hydrogen chemical concentration distribution and the donor concentration distribution in the depth direction at the position indicated by line A-A in FIG. 1. In this example, both the depth position Z1 and the depth position Z2 are disposed on the upper surface 21 side of the semiconductor substrate 10. Other configurations are the same as those of the example illustrated in FIG. 2.

According to this example, it is easy to cause the first donor concentration peak 111 and the second donor concentration peak 112 to serve as at least a part of the N type region formed on the upper surface 21 side of the semiconductor substrate 10. The N type region on the upper surface 21 side is, for example, an accumulation region to be described later.

Figure 6:
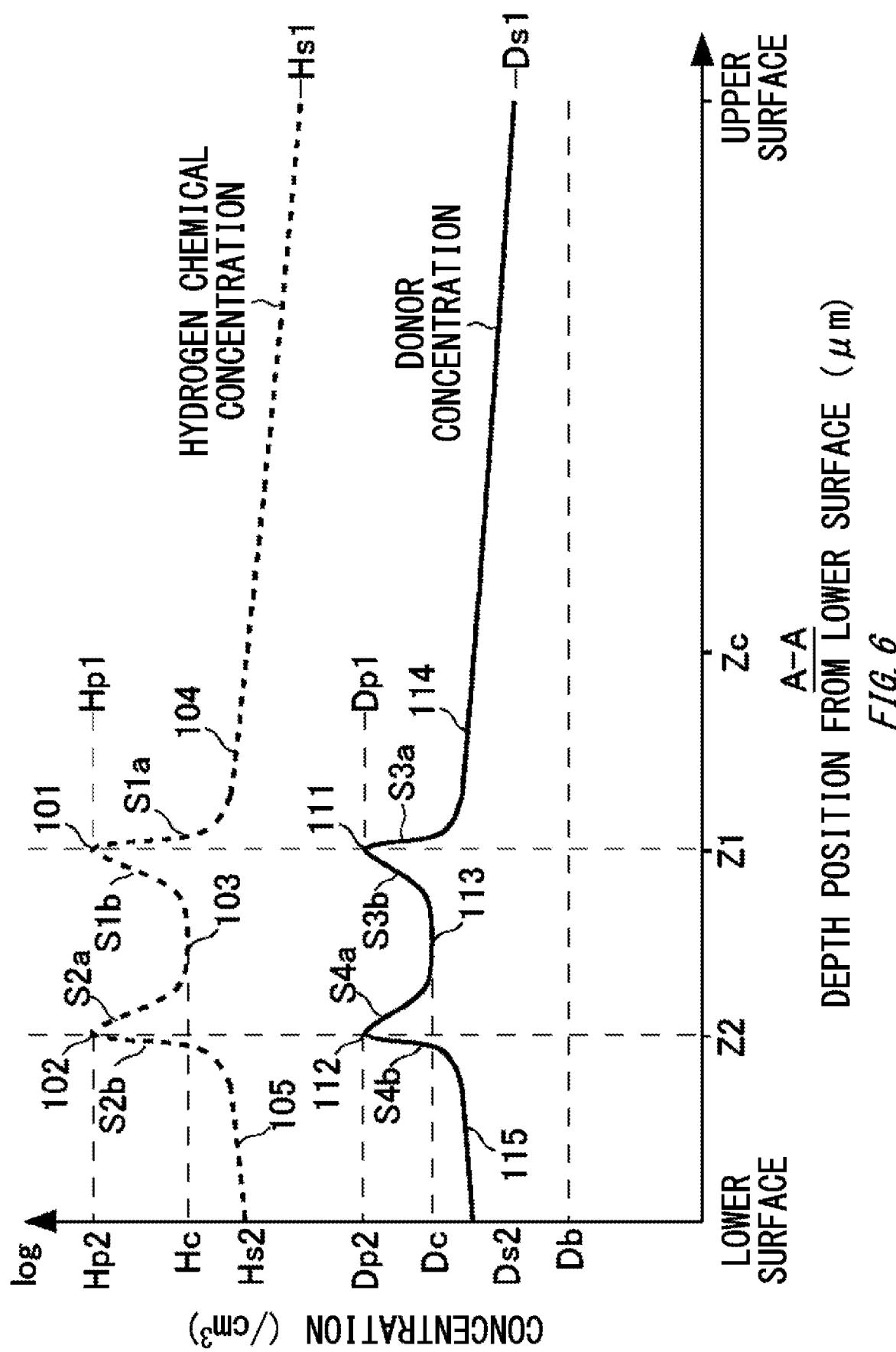
FIG. 6 illustrates another example of the hydrogen chemical concentration distribution and the donor concentration distribution in the depth direction at the position indicated by line A-A in FIG. 1.

FIG. 6 illustrates another example of the hydrogen chemical concentration distribution and the donor concentration distribution in the depth direction at the position indicated by line A-A in FIG. 1. In this example, both the depth position Z1 and the depth position Z2 are disposed on the lower surface 23 side of the semiconductor substrate 10. Other configurations are the same as those of the example illustrated in FIG. 2.

According to this example, it is easy to cause the first donor concentration peak 111 and the second donor concentration peak 112 to serve as at least a part of the N type region formed on the lower surface 23 side of the semiconductor substrate 10. The N type region on the lower surface 23 side is, for example, a buffer region to be described later.

Figure 7:
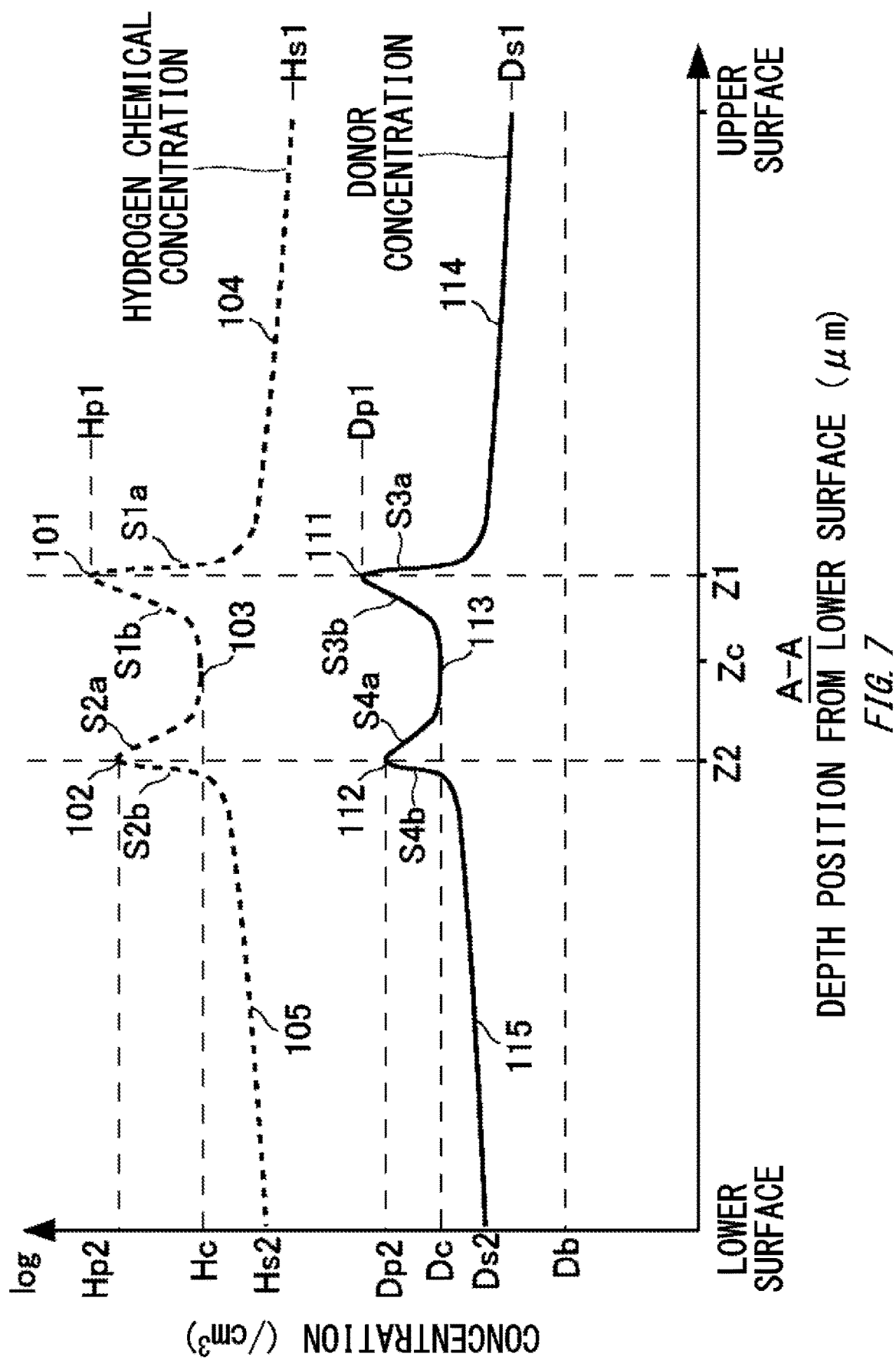
FIG. 7 illustrates another example of the hydrogen chemical concentration distribution and the donor concentration distribution in the depth direction at the position indicated by line A-A in FIG. 1.

FIG. 7 illustrates another example of the hydrogen chemical concentration distribution and the donor concentration distribution in the depth direction at the position indicated by line A-A in FIG. 1. In this example, the concentration of each peak and each distribution are different. The depth position of each peak is the same as any aspect described in FIGS. 2 to 6.

The hydrogen chemical concentration Hp1 of the first hydrogen concentration peak 101 in this example is higher than the hydrogen chemical concentration Hp2 of the second hydrogen concentration peak 102. Similarly, the donor concentration Dp1 of the first donor concentration peak 111 is higher than the donor concentration Dp2 of the second donor concentration peak 112.

In this example, the dosage of hydrogen ions from the lower surface 23 is higher than the dosage of hydrogen ions from the upper surface 21. Therefore, the hydrogen chemical concentration of the lower surface side hydrogen distribution 105 is higher than the hydrogen chemical concentration of the upper surface side hydrogen distribution 104. For example, in the lower surface side hydrogen distribution 105, the hydrogen chemical concentration at the position away from the first hydrogen concentration peak 101 by a distance Zx is higher than the hydrogen chemical concentration at the position away from the second hydrogen concentration peak 102 by the distance Zx in the upper surface side hydrogen distribution 104. The distance Zx is an arbitrary distance within the range of each distribution.

Also in the donor concentration distribution, the donor concentration of the lower surface side donor distribution 115 is higher than the donor concentration of the upper surface side donor distribution 114. For example, the donor concentration at a position away from the first donor concentration peak 111 by the distance Zx in the lower surface side donor distribution 115 is higher than the donor concentration at a position away from the second donor concentration peak 112 by the distance Zx in the upper surface side donor distribution 114.

Figure 8:
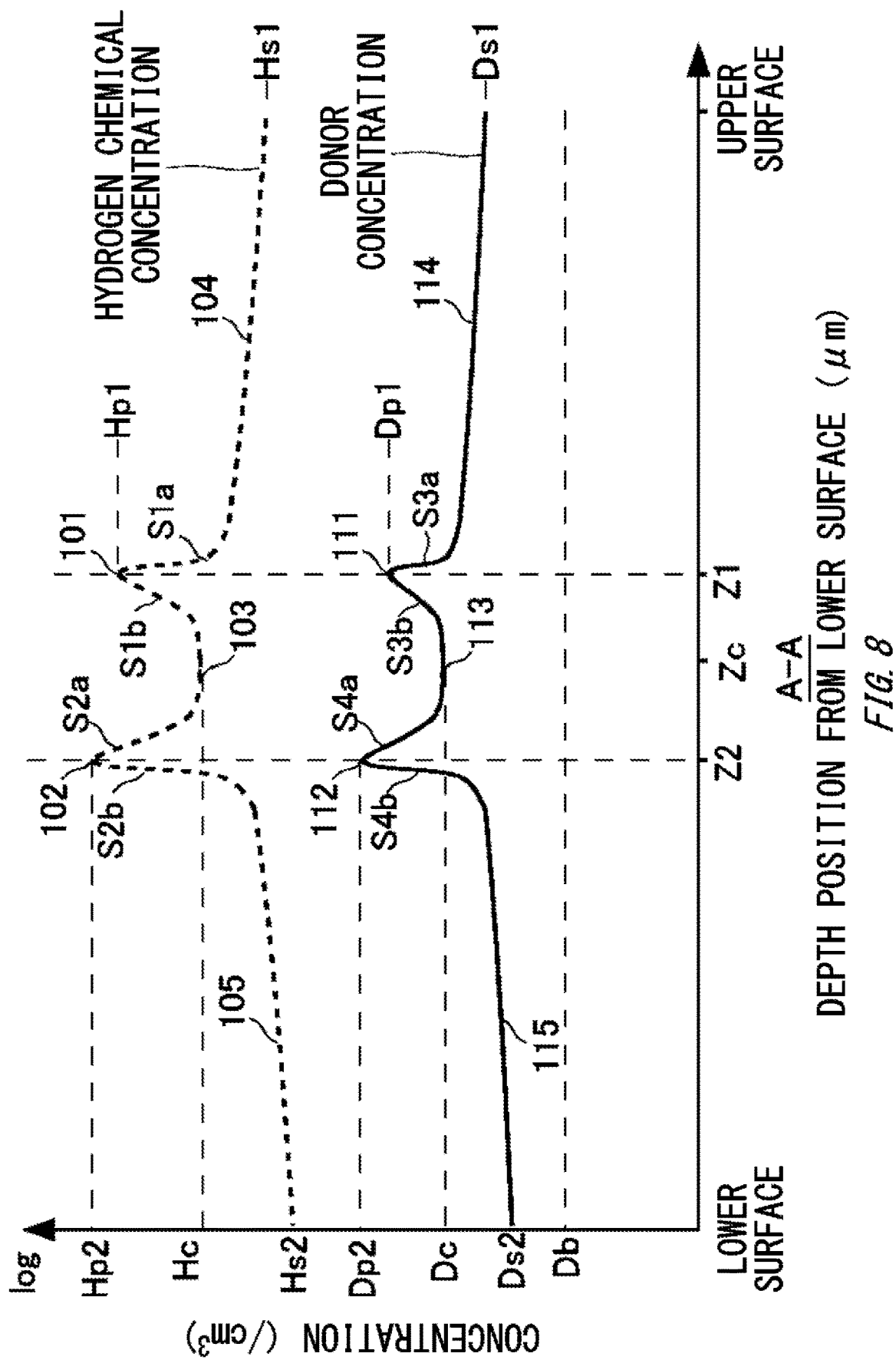
FIG. 8 illustrates another example of the hydrogen chemical concentration distribution and the donor concentration distribution in the depth direction at the position indicated by line A-A in FIG. 1.

FIG. 8 illustrates another example of the hydrogen chemical concentration distribution and the donor concentration distribution in the depth direction at the position indicated by line A-A in FIG. 1. In this example, the concentration of each peak and each distribution are different. The depth position of each peak is the same as any aspect described in FIGS. 2 to 6.

The hydrogen chemical concentration Hp2 of the second hydrogen concentration peak 102 in this example is higher than the hydrogen chemical concentration Hp1 of the first hydrogen concentration peak 101. Similarly, the donor concentration Dp2 of the second donor concentration peak 112 is higher than the donor concentration Dp1 of the first donor concentration peak 111.

In this example, the dosage of hydrogen ions from the upper surface 21 is higher than the dosage of hydrogen ions from the lower surface 23. Therefore, the hydrogen chemical concentration of the upper surface side hydrogen distribution 104 is higher than the hydrogen chemical concentration of the lower surface side hydrogen distribution 105. For example, in the upper surface side hydrogen distribution 104, the hydrogen chemical concentration at the position away from the second hydrogen concentration peak 102 by the distance Zx is higher than the hydrogen chemical concentration at the position away from the first hydrogen concentration peak 101 by the distance Zx in the lower surface side hydrogen distribution 105.

Also in the donor concentration distribution, the donor concentration of the upper surface side donor distribution 114 is higher than the donor concentration of the lower surface side donor distribution 115. For example, the donor concentration at the position away from the second donor concentration peak 112 by the distance Zx in the upper surface side donor distribution 114 is higher than the donor concentration at the position away from the first donor concentration peak 111 by the distance Zx in the lower surface side donor distribution 115. As described in FIGS. 2 to 8, the donor concentration distribution in the semiconductor substrate 10 can be appropriately adjusted by adjusting the position of each hydrogen concentration peak and the concentration.

Figure 9:
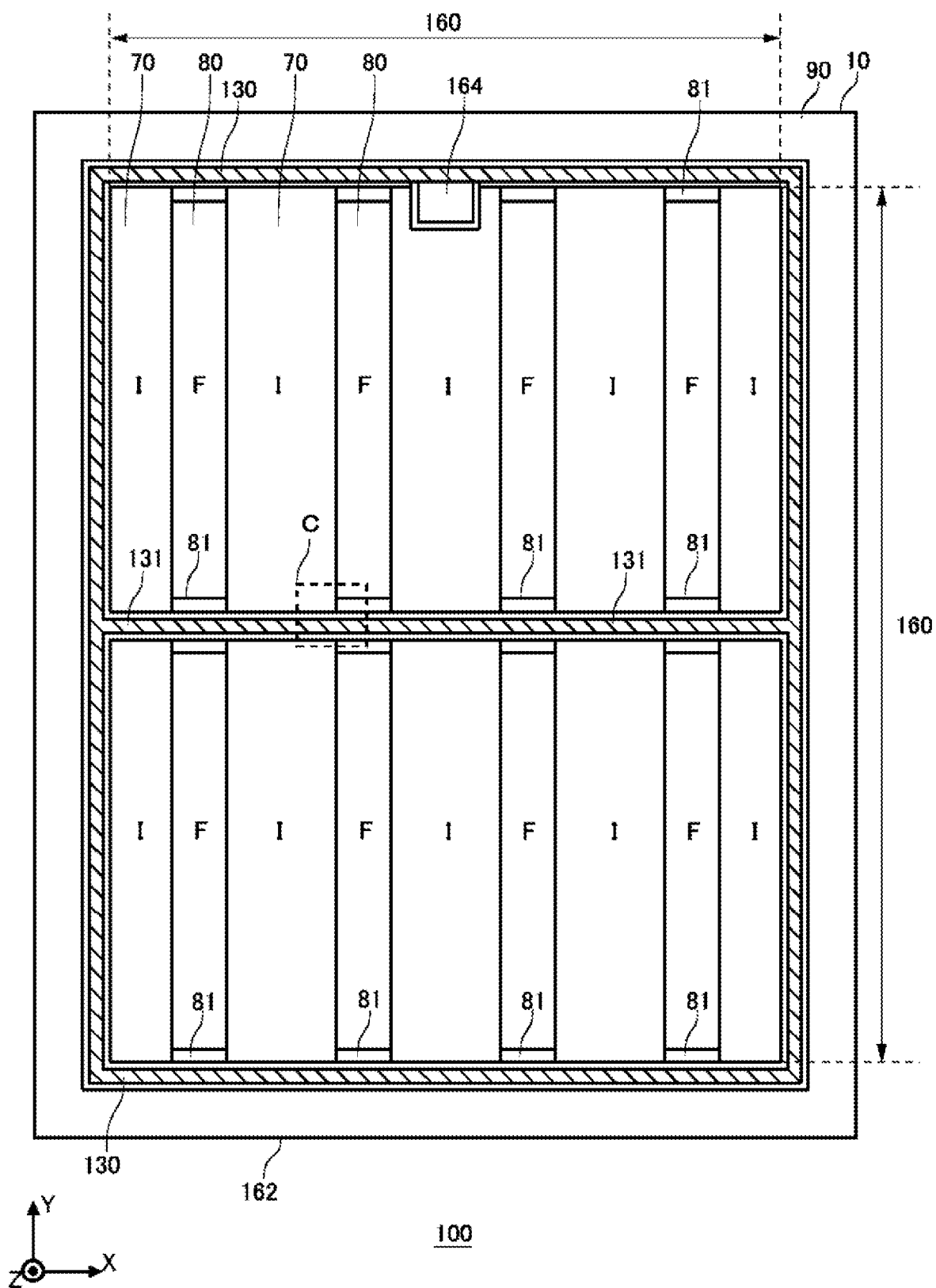
FIG. 9 is a top view illustrating an example of the semiconductor device 100.

FIG. 9 is a top view illustrating an example of the semiconductor device 100. FIG. 9 illustrates a position where each member is projected on the upper surface of the semiconductor substrate 10. In FIG. 9, only some members of the semiconductor device 100 are illustrated, and some members are omitted.

The semiconductor device 100 includes the semiconductor substrate 10. The semiconductor substrate 10 may have the hydrogen chemical concentration distribution and the donor concentration distribution of any aspect described in FIGS. 1 to 8. However, the semiconductor substrate 10 may further have another concentration peak different from each concentration peak described in FIGS. 1 to 8. As in a buffer region 20 to be described later, hydrogen ions may be implanted to form an N type region in the semiconductor substrate 10. In this case, the hydrogen chemical concentration distribution may have a hydrogen concentration peak in addition to the hydrogen concentration peak described in FIGS. 1 to 8. Further, as in the emitter region 12 to be described later, an N type impurity other than hydrogen such as phosphorus may be implanted to form an N type region in the semiconductor substrate 10. In this case, the donor concentration distribution may have a donor concentration peak in addition to the donor concentration peak described in FIGS. 1 to 8.

The semiconductor substrate 10 has an edge 162 in a top view. In the case of simply mentioning "in a top view" in the present specification, it means viewing from the upper surface side of the semiconductor substrate 10. The semiconductor substrate 10 of this example includes two sets of edges 162 facing each other in a top view. In FIG. 9, the X axis and the Y axis are parallel to any one of the edges 162. In addition, the Z axis is perpendicular to the upper surface of the semiconductor substrate 10.

The semiconductor substrate 10 is provided with an active portion 160. The active portion 160 is a region in which a main current flows in the depth direction, between the upper surface and the lower surface of the semiconductor substrate 10 in a case where the semiconductor device 100 operates. An emitter electrode is provided above the active portion 160, but is omitted in FIG. 9.

In the active portion 160, there is provided at least one of the transistor portion 70 which includes a transistor device such as an IGBT, and the diode portion 80 which includes a diode device such as a freewheeling diode (FWD). In the example of FIG. 9, the transistor portion 70 and the diode portion 80 are disposed alternately along a predetermined arrangement direction (the X axis direction in this example) in the upper surface of the semiconductor substrate 10. In another example, only one of the transistor portion 70 and the diode portion 80 may be provided in the active portion 160.

In FIG. 9, Symbol "I" is attached to the region where the transistor portion 70 is disposed, and Symbol "F" is attached to the region where the diode portion 80 is disposed. In the present specification, a direction perpendicular to the arrangement direction in a top view may be referred to as a stretching direction (the Y axis direction in FIG. 9). The transistor portion 70 and the diode portion 80 may each include a longitudinal side in the stretching direction. In other words, the length of the transistor portion 70 in the Y axis direction is larger than the width in the X axis direction. Similarly, the length of the diode portion 80 in the Y axis direction may be larger than the width in the X axis direction. The stretching direction of the transistor portion 70 and the diode portion 80 and the longitudinal direction of each trench portion described later may be the same.

The diode portion 80 includes an N+ type cathode region in a region in contact with the lower surface of the semiconductor substrate 10. In the present specification, the region where the cathode region is provided is referred to as the diode portion 80. In other words, the diode portion 80 is a region overlapping with the cathode region in a top view. In the lower surface of the semiconductor substrate 10, a P+ type collector region may be provided in the region other than the cathode region. In the present specification, the extension region 81 extending from the diode portion 80 to a gate runner to be described later in the Y axis direction may also be included in the diode portion 80. In the lower surface of the extension region 81, a collector region is provided.

The transistor portion 70 includes a P+ type collector region in a region in contact with the lower surface of the semiconductor substrate 10. In addition, in the transistor portion 70, there is periodically disposed a gate structure, which includes an N type emitter region, a P type base region, a gate conductive portion, and a gate insulating film, on the upper surface side on the semiconductor substrate 10.

The semiconductor device 100 may include one or more pads on the upper side of the semiconductor substrate 10. The semiconductor device 100 of this example includes a gate pad 164. The semiconductor device 100 may include pads such as an anode pad, a cathode pad, and a current detection pad. Each pad is disposed in the vicinity of the edge 162. The vicinity of the edge 162 indicates a region between the edge 162 and the emitter electrode in a top view. When mounting the semiconductor device 100, each pad may be connected to an external circuit via a wiring such as a wire.

A gate potential is applied to the gate pad 164. The gate pad 164 is electrically connected to the conductive portion of a gate trench portion of the active portion 160. The semiconductor device 100 is provided with a gate runner to connect the gate pad 164 and the gate trench portion. In FIG. 9, the gate runner is hatched with inclined lines.

The gate runner of this example includes an outer peripheral gate runner 130 and an active-side gate wiring 131. The outer peripheral gate runner 130 is disposed between the active portion 160 and the edge 162 of the semiconductor substrate 10 in a top view. The outer peripheral gate runner 130 of this example surrounds the active portion 160 in a top view. The region surrounding the outer peripheral gate runner 130 in a top view may be called the active portion 160. In addition, the outer peripheral gate runner 130 is connected to the gate pad 164. The outer peripheral gate runner 130 is disposed on the upper side of the semiconductor substrate 10. The outer peripheral gate runner 130 may be a metal wiring containing aluminum or the like.

The active-side gate wiring 131 is provided in the active portion 160. With the provision of the active-side gate wiring 131 in the active portion 160, it is possible to reduce a variation in wiring length from the gate pad 164 in each region of the semiconductor substrate 10.

The active-side gate wiring 131 is connected to the gate trench portion of the active portion 160. The active-side gate wiring 131 is disposed on the upper side of the semiconductor substrate 10. The active-side gate wiring 131 may be a wiring formed of a semiconductor such as polysilicon doped with an impurity.

The active-side gate wiring 131 may be connected to the outer peripheral gate runner 130. The active-side gate wiring 131 of this example is provided to extend in the X axis direction from one outer peripheral gate runner 130 in almost the center of the Y axis direction up to the other outer peripheral gate runner 130 so as to traverse the active portion 160. In a case where the active portion 160 is divided by the active-side gate wiring 131, the transistor portion 70 and the diode portion 80 may be alternately disposed in the X axis direction in each divided region.

In addition, the semiconductor device 100 may be provided with a temperature sense portion (not illustrated) which is a PN junction diode formed of polysilicon or the like, and a current detection portion (not illustrated) which simulates the operation of the transistor portion provided in the active portion 160.

The semiconductor device 100 of this example includes an edge termination structure portion 90 between the active portion 160 and the edge 162 in a top view. The edge termination structure portion 90 of this example is disposed between the outer peripheral gate runner 130 and the edge 162. The edge termination structure portion 90 reduces an electric field strength on the upper surface side of the semiconductor substrate 10. The edge termination structure portion 90 may be provided with at least one of a guard ring, a field plate, and a RESURF provided annularly around the active portion 160.

Figure 10:
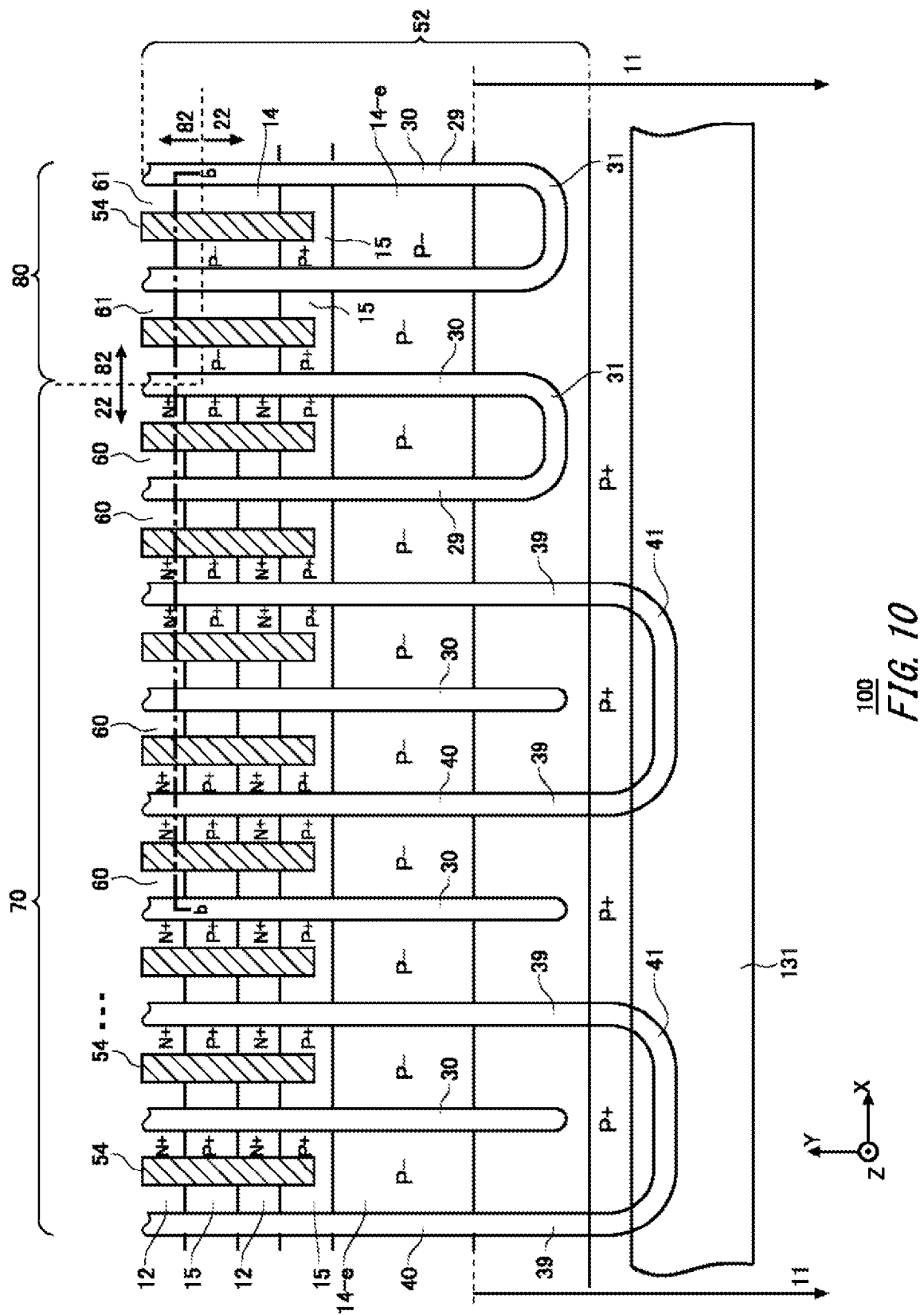
FIG. 10 is an enlarged view of a region C in FIG. 9.

FIG. 10 is an enlarged view of Region C in FIG. 9. Region C is a region where the transistor portion 70, the diode portion 80, and the active-side gate wiring 131 are included. The semiconductor device 100 of this example is provided with a gate trench portion 40, a dummy trench portion 30, a well region 11, an emitter region 12, a base region 14, and a contact region 15, which are provided in the inside on the upper surface side of the semiconductor substrate 10. The gate trench portion 40 and the dummy trench portion 30 each are an example of the trench portion. In addition, the semiconductor device 100 of this example is provided with an emitter electrode 52 and the active-side gate wiring 131 which are provided on the upper side of the upper surface of the semiconductor substrate 10. The emitter electrode 52 and the active-side gate wiring 131 are provided to be separated from each other.

An interlayer dielectric film is provided between the upper surface of the semiconductor substrate 10 and the emitter electrode 52 and the active-side gate wiring 131, but is omitted in FIG. 10. In the interlayer dielectric film of this example, a contact hole 54 is provided to pass through the interlayer insulating film. In FIG. 10, each contact hole 54 is hatched with inclined lines.

The emitter electrode 52 is provided on the upper side of the gate trench portion 40, the dummy trench portion 30, the well region 11, the emitter region 12, the base region 14, and the contact region 15. The emitter electrode 52 is in contact with the emitter region 12, the contact region 15, and the base region 14 in the upper surface of the semiconductor substrate 10 through the contact hole 54. In addition, the emitter electrode 52 is connected to a dummy conductive portion in the dummy trench portion 30 through the contact hole provided in the interlayer dielectric film. The emitter electrode 52 may be connected to the dummy conductive portion of the dummy trench portion 30 at the edge of the dummy trench portion 30 in the Y axis direction.

The active-side gate wiring 131 is connected to the gate trench portion 40 through the contact hole provided in the interlayer dielectric film. The active-side gate wiring 131 may be connected to a gate conductive portion of the gate trench portion 40 in an edge portion 41 of the gate trench portion 40 in the Y axis direction. The active-side gate wiring 131 is not connected to the dummy conductive portion in the dummy trench portion 30.

The emitter electrode 52 is formed of a material containing metal. FIG. 10 illustrates a range where the emitter electrode 52 is provided. For example, at least a partial region of the emitter electrode 52 is formed of aluminum or an aluminum-silicon alloy, for example, a metal alloy such as AlSi or AlSiCu. The emitter electrode 52 may have a barrier metal formed of titanium or a titanium compound in the lower layer of the region formed of aluminum or the like. Further, in the contact hole, a plug formed with tungsten buried therein may be included to be in contact with the barrier metal, aluminum, or the like.

The well region 11 is provided to be overlapped with the active-side gate wiring 131. The well region 11 is provided to extend with a predetermined width even in a range where the active-side gate wiring 131 is not overlapped. The well region 11 of this example is provided to be separated from the end of the contact hole 54 in the Y axis direction toward the active-side gate wiring 131. The well region 11 is a second conductivity type region in which its doping concentration is higher than that of the base region 14. The base region 14 in this example is a P− type, and the well region 11 is a P+ type.

Each of the transistor portion 70 and the diode portion 80 includes a plurality of trench portions disposed in the arrangement direction. In the transistor portion 70 of this example, one or more gate trench portions 40 and one or more dummy trench portions 30 are alternately provided along the arrangement direction. In the diode portion 80 of this example, the plurality of dummy trench portions 30 are provided along the arrangement direction. In the diode portion 80 of this example, the gate trench portion 40 is not provided.

The gate trench portion 40 of this example may include two linear portions 39 (trench portions that are linear along the stretching direction) extending along the stretching direction perpendicular to the arrangement direction, and the edge portion 41 for connecting the two linear portions 39. The stretching direction in FIG. 10 is the Y axis direction.

At least a part of the edge portion 41 is desirably provided in a curved shape in a top view. The ends of two linear portions 39 in the Y axis direction are connected to the edge portion 41, so that the electric field strength in the end portion of the linear portion 39 can be reduced.

In the transistor portion 70, the dummy trench portion 30 is provided between the linear portions 39 of the gate trench portion 40. Between the linear portions 39, one dummy trench portion 30 may be provided, or a plurality of dummy trench portions 30 may be provided. The dummy trench portion 30 may be in a linear shape extending in the stretching direction, or may include a linear portion 29 and an edge portion 31 similarly to the gate trench portion 40. The semiconductor device 100 illustrated in FIG. 10 includes both the linear dummy trench portion 30 having no edge portion 31, and the dummy trench portion 30 having the end portion 31.

A diffusion depth of the well region 11 may be deeper than the depths of the gate trench portion 40 and the dummy trench portion 30. The end portions of the gate trench portion 40 and the dummy trench portion 30 in the Y axis direction are provided in the well region 11 in a top view. In other words, the bottom of each trench portion in the depth direction is covered with the well region 11 at the end portion of each trench portion in the Y axis direction. With this configuration, the electric field strength in the bottom of each trench portion can be reduced.

A mesa portion is provided between the trench portions in the arrangement direction. The mesa portion indicates a region sandwiched between the trench portions in the semiconductor substrate 10. As an example, the upper end of the mesa portion is the upper surface of the semiconductor substrate 10. The depth position of the lower end of the mesa portion is the same as the depth position of the lower end of the trench portion. The mesa portion of this example is provided to extend in the stretching direction (Y axis direction) along the trench in the upper surface of the semiconductor substrate 10. In this example, a mesa portion 60 is provided in the transistor portion 70, and a mesa portion 61 is provided in the diode portion 80. In the case of simply mentioning "mesa portion" in the present specification, the portion indicates each of the mesa portion 60 and the mesa portion 61.

Each mesa portion is provided with the base region 14. In the base region 14 exposed to the upper surface of the semiconductor substrate 10 in the mesa portion, a region disposed nearest to the active-side gate wiring 131 is referred to as a base region 14-e. In FIG. 10, the base region 14-e disposed in one end portion of each mesa portion in the stretching direction is illustrated. However, the base region 14-e is disposed also in the other end portion of each mesa portion. In each mesa portion, at least one of the first conductivity type emitter region 12 and the second conductivity type contact region 15 may be provided in the region sandwiched between the base regions 14-e in a top view. The emitter region 12 of this example is an N+ type, and the contact region 15 is a P+ type. The emitter region 12 and the contact region 15 may be provided between the base region 14 and the upper surface of the semiconductor substrate 10 in the depth direction.

The mesa portion 60 of the transistor portion 70 includes the emitter region 12 exposed to the upper surface of the semiconductor substrate 10. The emitter region 12 is provided in contact with the gate trench portion 40. The mesa portion 60 in contact with the gate trench portion 40 may be provided with the contact region 15 exposed to the upper surface of the semiconductor substrate 10.

Each of the contact region 15 and the emitter region 12 in the mesa portion 60 is provided from one trench portion in the X axis direction to the other trench portion. As an example, the contact region 15 and the emitter region 12 of the mesa portion 60 are alternately disposed along the stretching direction (Y axis direction) of the trench portion.

In another example, the contact region 15 and the emitter region 12 of the mesa portion 60 may be provided in a stripe shape along the stretching direction (Y axis direction) of the trench portion. For example, the emitter region 12 is provided in a region in contact with the trench portion, and the contact region 15 is provided in a region sandwiched between the emitter regions 12.

The emitter region 12 is not provided in the mesa portion 61 of the diode portion 80. The base region 14 and the contact region 15 may be provided on the upper surface of the mesa portion 61. The contact region 15 may be provided in contact with each of the base regions 14-e in a region sandwiched between the base regions 14-e on the upper surface of the mesa portion 61. The base region 14 may be provided in a region sandwiched between the contact regions 15 on the upper surface of the mesa portion 61. The base region 14 may be disposed in the entire region sandwiched between the contact regions 15.

The contact hole 54 is provided above each mesa portion. The contact hole 54 is disposed in a region sandwiched between the base regions 14-e. The contact hole 54 of this example is provided above each region of the contact region 15, the base region 14, and the emitter region 12. The contact hole 54 is not provided in a region corresponding to the base region 14-e and the well region 11. The contact hole 54 may be disposed at the center in the arrangement direction (X axis direction) of the mesa portion 60.

In the diode portion 80, an N+ type cathode region 82 is provided in a region adjacent to the lower surface of the semiconductor substrate 10. On the lower surface of the semiconductor substrate 10, a P+ type collector region 22 may be provided in a region where the cathode region 82 is not provided. The cathode region 82 and the collector region 22 are provided between the lower surface 23 of the semiconductor substrate 10 and the buffer region 20. In FIG. 10, the boundary between the cathode region 82 and the collector region 22 is indicated by a dotted line.

The cathode region 82 is disposed away from the well region 11 in the Y axis direction. As a result, a distance between the P type region (well region 11) having a relatively high doping concentration and formed up to a deep position and the cathode region 82 is secured, and the withstand voltage can be improved. The end of the cathode region 82 of this example in the Y axis direction is disposed farther from the well region 11 than the end of the contact hole 54 in the Y axis direction. In another example, the end of the cathode region 82 in the Y axis direction may be disposed between the well region 11 and the contact hole 54.

Figure 11:
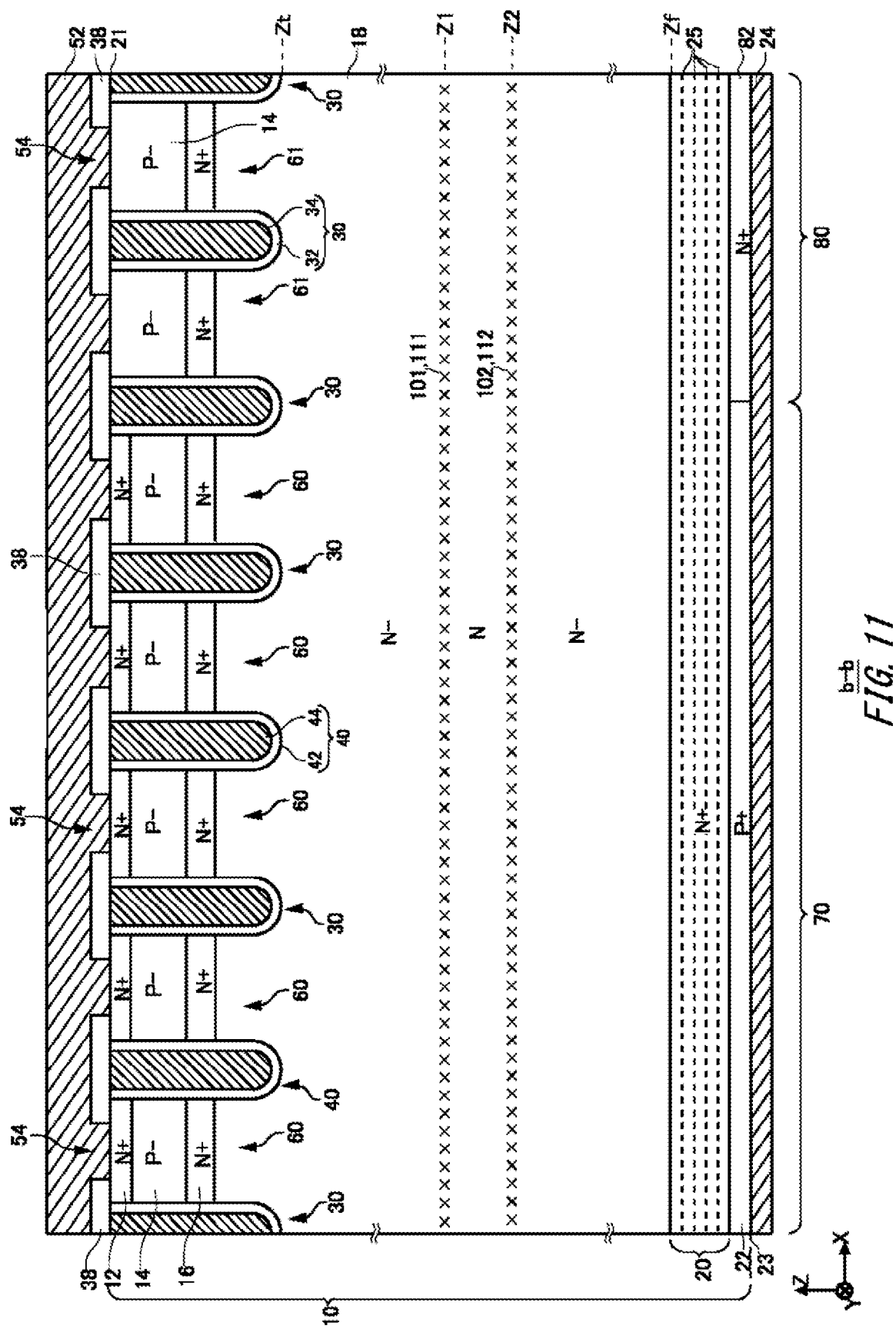
FIG. 11 is a diagram illustrating an example of a b-b cross section in FIG. 10.

FIG. 11 is a diagram illustrating an example of a b-b cross section in FIG. 10. The b-b cross section is an XZ plane passing through the emitter region 12 and the cathode region 82. The semiconductor device 100 of this example includes the semiconductor substrate 10, an interlayer dielectric film 38, the emitter electrode 52, and a collector electrode 24 in the cross section.

The interlayer dielectric film 38 is provided on the upper surface of the semiconductor substrate 10. The interlayer dielectric film 38 is a film including at least one of a dielectric film such as silicate glass to which an impurity such as boron or phosphorus is added, a thermal oxide film, and other dielectric films. The interlayer dielectric film 38 is provided with the contact hole 54 described in FIG. 10.

The emitter electrode 52 is provided above the interlayer dielectric film 38. The emitter electrode 52 is in contact with the upper surface 21 of the semiconductor substrate 10 through the contact hole 54 of the interlayer dielectric film 38. The collector electrode 24 is provided on the lower surface 23 of the semiconductor substrate 10. The emitter electrode 52 and the collector electrode 24 are made of a metal material such as aluminum. In the present specification, the direction (Z axis direction) connecting the emitter electrode 52 and the collector electrode 24 is referred to as a depth direction.

The semiconductor substrate 10 has an N type or N− type drift region 18. The drift region 18 is provided in each of the transistor portion 70 and the diode portion 80.

In the mesa portion 60 of the transistor portion 70, an N+ type emitter region 12 and a P− type base region 14 are provided in order from the upper surface 21 side of the semiconductor substrate 10. The drift region 18 is provided below the base region 14. The mesa portion 60 may be provided with an N+ type accumulation region 16. The accumulation region 16 is disposed between the base region 14 and the drift region 18.

The emitter region 12 is exposed to the upper surface 21 of the semiconductor substrate 10 and is provided in contact with the gate trench portion 40. The emitter region 12 may be in contact with the trench portions on both sides of the mesa portion 60. The emitter region 12 has a higher doping concentration than the drift region 18.

The base region 14 is provided below the emitter region 12. The base region 14 of this example is provided in contact with the emitter region 12. The base region 14 may be in contact with the trench portions on both sides of the mesa portion 60.

The accumulation region 16 is provided below the base region 14. The accumulation region 16 is an N+ type region having a higher doping concentration than the drift region 18. By providing the high-concentration accumulation region 16 between the drift region 18 and the base region 14, the carrier injection enhancement effect (IE effect) can be increased, and the ON voltage can be reduced. The accumulation region 16 may be provided so as to cover the entire lower surface of the base region 14 in each mesa portion 60.

The mesa portion 61 of the diode portion 80 is provided with a P− type base region 14 in contact with the upper surface 21 of the semiconductor substrate 10. The drift region 18 is provided below the base region 14. In the mesa portion 61, the accumulation region 16 may be provided below the base region 14.

In each of the transistor portion 70 and the diode portion 80, an N+ type buffer region 20 may be provided under the drift region 18. The doping concentration of the buffer region 20 is higher than the doping concentration of the drift region 18. The buffer region 20 has a concentration peak 25 having a higher doping concentration than the drift region 18. The doping concentration of the concentration peak 25 refers to the doping concentration at the local maximum of the concentration peak 25. As the doping concentration of the drift region 18, an average value of the doping concentration in a region where the doping concentration distribution is substantially flat may be used. The doping concentration of the drift region 18 may be an average value of the doping concentration of the flat portion 150 described in FIG. 3.

The buffer region 20 of this example has three or more concentration peaks 25 in the depth direction (Z axis direction) of the semiconductor substrate 10. The concentration peak 25 of the buffer region 20 may be provided at the same depth position as the concentration peak of hydrogen (proton) or phosphorus, for example. The buffer region 20 may serve as a field stop layer that prevents a depletion layer extending from the lower end of the base region 14 from reaching the P+ type collector region 22 and the N+ type cathode region 82.

In the transistor portion 70, the P+ type collector region 22 is provided below the buffer region 20. The acceptor concentration of the collector region 22 is higher than the acceptor concentration of the base region 14. The collector region 22 may include the same acceptor as the base region 14, and may include a different acceptor. The acceptor of the collector region 22 is, for example, boron.

In the diode portion 80, the N+ type cathode region 82 is provided below the buffer region 20. The donor concentration of the cathode region 82 is higher than the donor concentration of the drift region 18. The donor of the cathode region 82 is, for example, hydrogen or phosphorus. Elements to be donors and acceptors in each region are not limited to the examples described above. The collector region 22 and the cathode region 82 are exposed to the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface 21 side of the semiconductor substrate 10. Each trench portion penetrates the base region 14 from the upper surface 21 of the semiconductor substrate 10 to reach the drift region 18. In the region where at least any one of the emitter region 12, the contact region 15, and the accumulation region 16 is provided, each trench portion also penetrates these doping regions and reaches the drift region 18. The trench portion penetrating the doping region is not limited to those manufactured in the order of forming the doping region and then forming the trench portion. A case where a doping region is formed between the trench portions after the trench portion is formed is also included in a case where the trench portion penetrates the doping region.

As described above, the transistor portion 70 is provided with the gate trench portion 40 and the dummy trench portion 30. The diode portion 80 is provided with the dummy trench portion 30 and is not provided with the gate trench portion 40. In this example, the boundary between the diode portion 80 and the transistor portion 70 in the X axis direction is the boundary between the cathode region 82 and the collector region 22.

The gate trench portion 40 includes a gate trench, a gate insulating film 42, and a gate conductive portion 44 provided on the upper surface 21 of the semiconductor substrate 10. The gate insulating film 42 is provided to cover the inner wall of the gate trench. The gate insulating film 42 may be formed by oxidizing or nitriding the semiconductor in the inner wall of the gate trench. The gate conductive portion 44 is provided inside the gate insulating film 42 in the gate trench. That is, the gate insulating film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered with the interlayer dielectric film 38 in the upper surface 21 of the semiconductor substrate 10. The gate conductive portion 44 is electrically connected to the gate runner. When a predetermined gate voltage is applied to the gate conductive portion 44, a channel by an inversion layer of electrons is formed in a surface layer of the boundary in contact with the gate trench portion 40 in the base region 14.

The dummy trench portion 30 may have the same structure as the gate trench portion 40 in the cross section. The dummy trench portion 30 includes a dummy trench provided in the upper surface 21 of the semiconductor substrate 10, a dummy insulating film 32, and a dummy conductive portion 34. The dummy conductive portion 34 is electrically connected to the emitter electrode 52. The dummy insulating film 32 is provided to cover the inner wall of the dummy trench. The dummy conductive portion 34 is provided in the dummy trench and is provided inside the dummy insulating film 32. The dummy insulating film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction.

The gate trench portion 40 and the dummy trench portion 30 of this example are covered with the interlayer dielectric film 38 in the upper surface 21 of the semiconductor substrate 10. Note that the bottoms of the dummy trench portion 30 and the gate trench portion 40 may have a curved surface shape protruding downward (a curved shape in a cross section).

As described in FIGS. 1 to 8, the semiconductor substrate 10 has the first hydrogen concentration peak 101 and the first donor concentration peak 111 at the depth position Z1, and the second hydrogen concentration peak 102 and the second donor concentration peak 112 at the depth position Z2.

The depth position Z1 may be disposed in the accumulation region 16, may be disposed between a lower end position Zt of the trench portion and an upper end position Zf of the buffer region 20, and may be disposed in the buffer region 20. The depth position Z2 may be similarly disposed in the accumulation region 16, may be disposed between the lower end position Zt of the trench portion and the upper end position Zf of the buffer region 20, and may be disposed in the buffer region 20.

Figure 12:
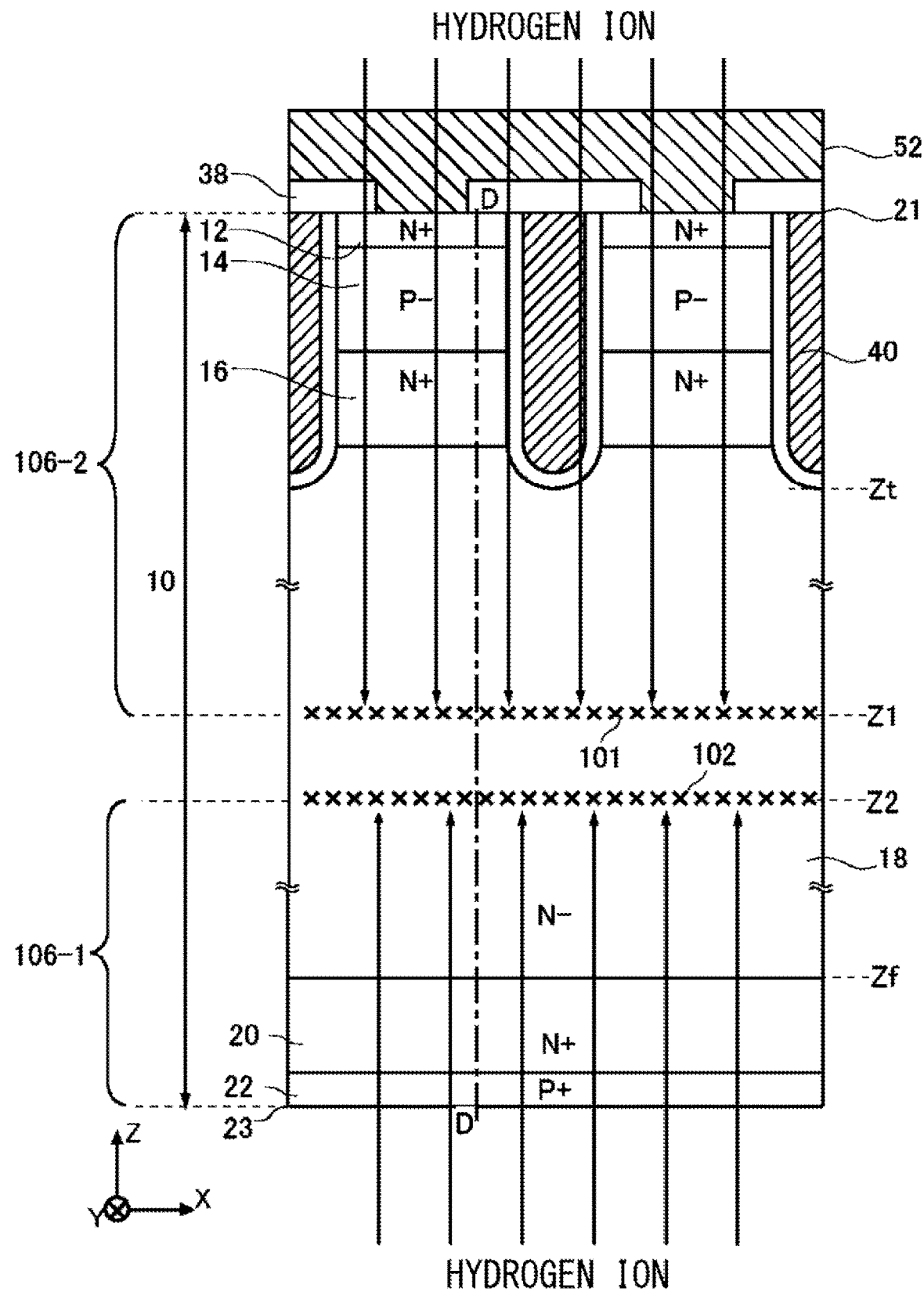
FIG. 12 is a diagram illustrating another example of a pass-through region 106-1 and a pass-through region 106-2.

FIG. 12 is a diagram illustrating another example of the pass-through region 106-1 and the pass-through region 106-2. The pass-through region 106-1 and the pass-through region 106-2 of this example do not overlap. That is, the pass-through region 106-1 and the pass-through region 106-2 are disposed apart from each other in the depth direction.

In this example, hydrogen ions are implanted from the upper surface 21 side of the semiconductor substrate 10 into the depth position Z1 of the semiconductor substrate 10. Hydrogen ions are implanted from the lower surface 23 side of the semiconductor substrate 10 into a depth position Z2 closer to the lower surface 23 side than the depth position Z1. The depth positions Z1 and Z2 in this example are disposed between the lower end position Zt of the trench portion and the upper end position Zf of the buffer region 20.

Figure 13:
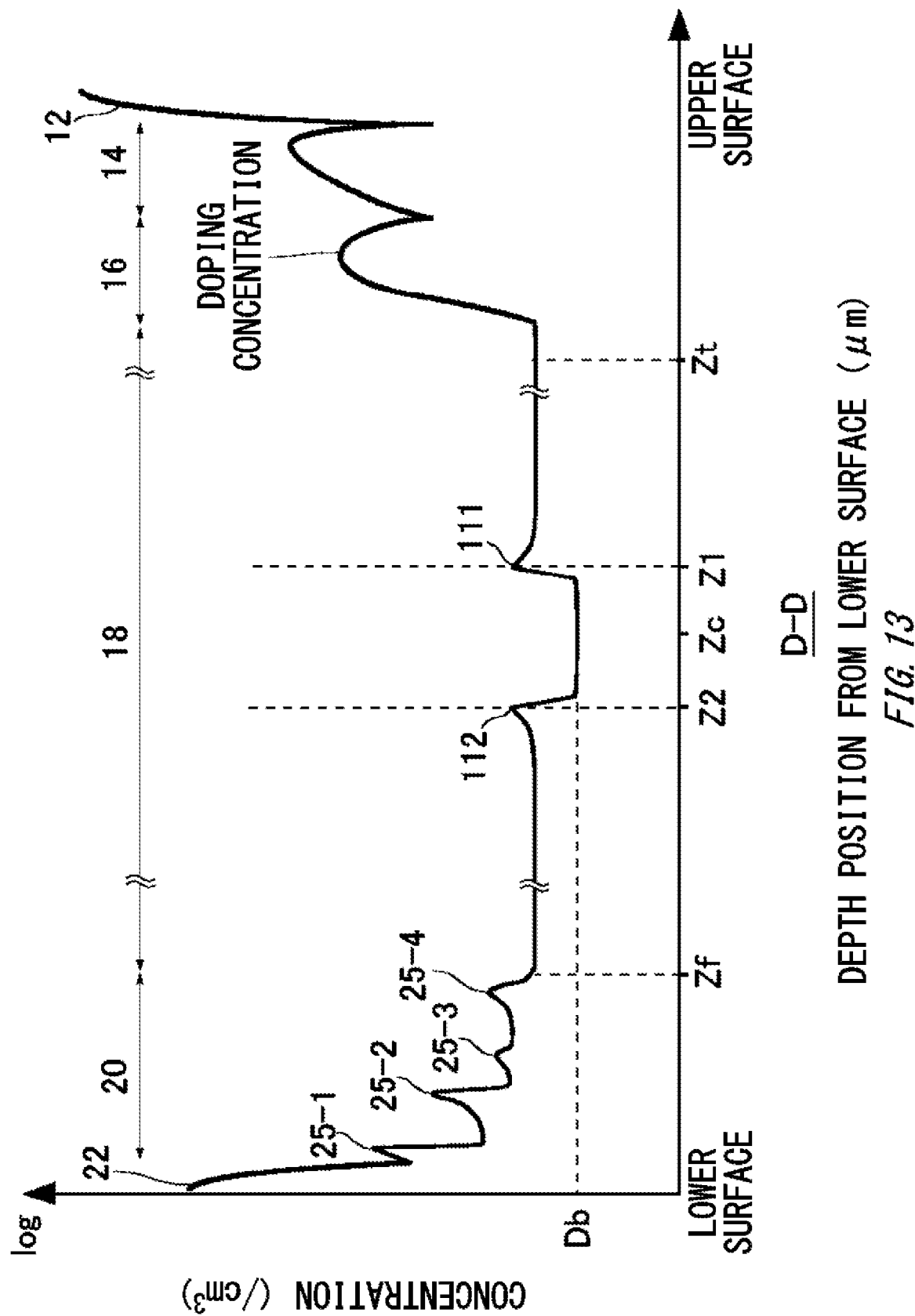
FIG. 13 is a diagram illustrating an example of a doping concentration distribution taken along line D-D in FIG. 12.

FIG. 13 is a diagram illustrating an example of a doping concentration distribution taken along line D-D in FIG. 12. In this example, the doping concentration distribution in each region is illustrated in addition to the donor concentration distribution due to VOH defects.

Bulk donors such as phosphorus are distributed throughout the semiconductor substrate 10. The emitter region 12 contains an N type dopant such as phosphorus. The base region 14 contains a P type dopant such as boron. The accumulation region 16 includes an N type dopant such as phosphorus or hydrogen.

The drift region 18 contains hydrogen in at least a part of the region. In the drift region 18, the first donor concentration peak 111 and the second donor concentration peak 112 are disposed.

The buffer region 20 of this example has a plurality of concentration peaks 25-1, 25-2, 25-3, and 25-4 in the doping concentration distribution. Each concentration peak 25 is formed by implanting hydrogen ions. The collector region 22 contains a P type dopant such as boron.

Figure 14:
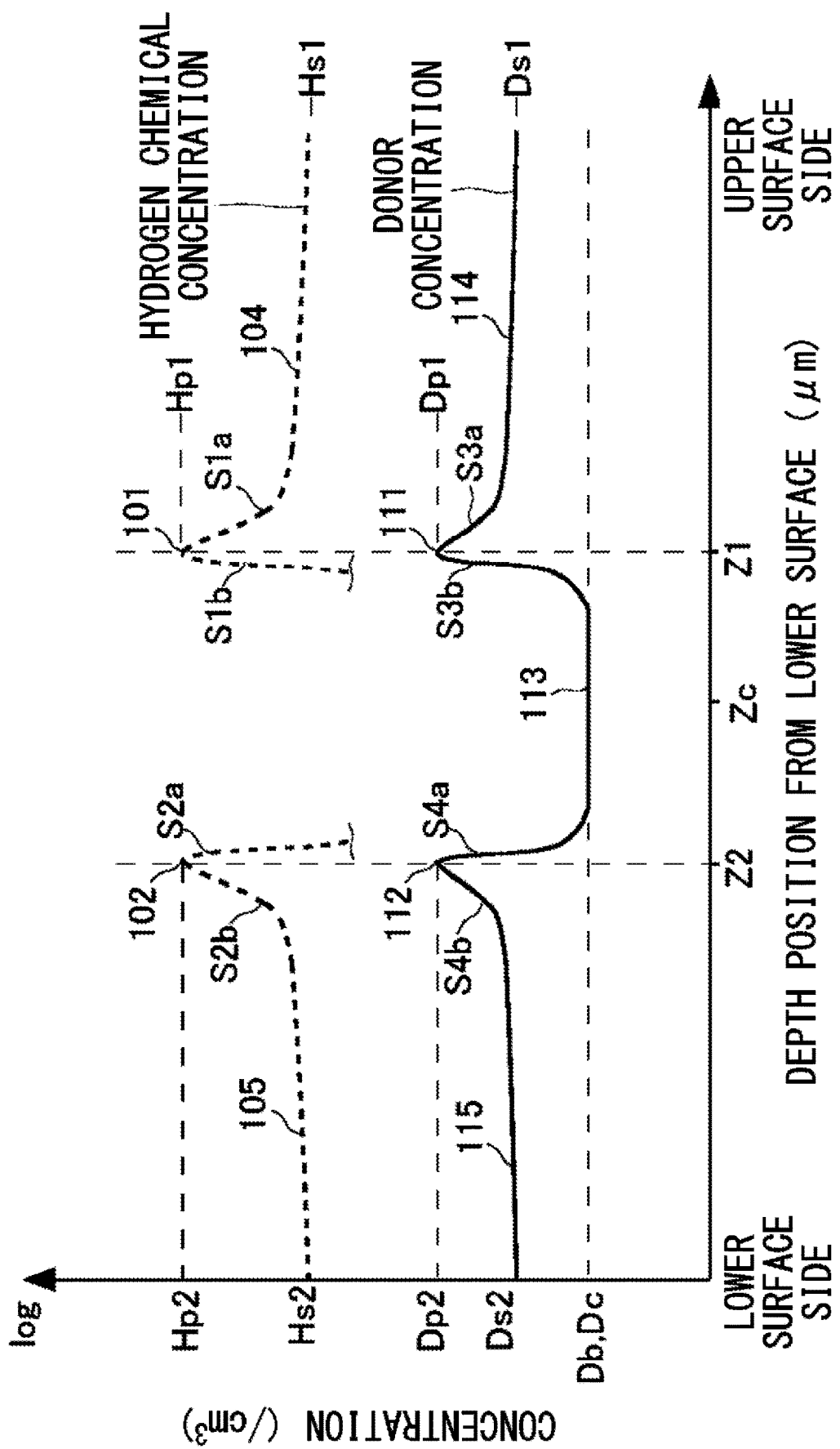
FIG. 14 is a diagram illustrating an example of a hydrogen chemical concentration distribution and a donor concentration distribution in a region near a depth position Z1 and a depth position Z2 illustrated in FIG. 13.

FIG. 14 is a diagram illustrating an example of the hydrogen chemical concentration distribution and the donor concentration distribution in a region near the depth position Z1 and the depth position Z2 illustrated in FIG. 13. In this example, hydrogen does not pass through the region between the depth position Z1 and the depth position Z2. Therefore, a VOH defect is not formed in the region. On the other hand, VOH defects are formed in a region between the depth position Z1 and the upper surface 21 and a region between the depth position Z2 and the lower surface 23.

In this example, the intermediate donor concentration Dc in the intermediate donor distribution 113 between the depth position Z1 and the depth position Z2 is lower than any of the upper surface side donor concentration Ds1 in the upper surface side donor distribution 114 and the lower surface side donor concentration Ds2 in the lower surface side donor distribution 115. The intermediate donor concentration Dc may be the same as the bulk donor concentration Db. Both the upper surface side donor concentration Ds1 and the lower surface side donor concentration Ds2 are higher than the bulk donor concentration Db. The upper surface side donor concentration Ds1 and the lower surface side donor concentration Ds2 may be twice or more, three times or more, or five times or more the intermediate donor concentration Dc.

Also in this example, the depth position Z1 and the depth position Z2 may be disposed similarly to the examples illustrated in FIGS. 2 to 8. However, the depth positions Z1 and Z2 are preferably disposed between the depth positions Zt and Zf. For example, as illustrated in FIG. 5, both the first hydrogen concentration peak 101 and the second hydrogen concentration peak 102 may be disposed on the upper surface 21 side of the semiconductor substrate 10. As a result, the region of the intermediate donor distribution 113 having a relatively low donor concentration can be disposed on the upper surface 21 side of the semiconductor substrate 10. Depending on the structure of the semiconductor device 100, the electric field may be likely to concentrate on the upper surface 21 side. Even in such a case, the electric field strength on the upper surface 21 side can be reduced by disposing the intermediate donor distribution 113 on the upper surface 21 side.

In each example illustrated in FIGS. 1 to 14, the distance between the depth positions Z1 and Z2 in the depth direction may be ½ or less of the thickness of the semiconductor substrate 10 in the depth direction. The distance may be ¼ or less or 1/10 or less of the thickness. In the example of FIG. 13, the donor concentration of the semiconductor substrate 10 can be adjusted within a wide range in the depth direction by reducing the distance.

Figure 15:
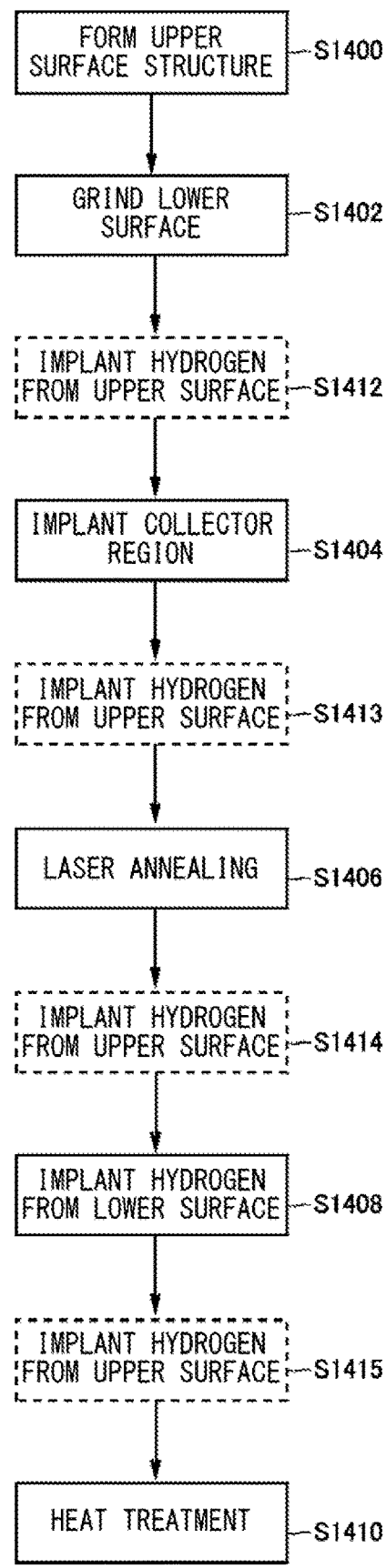
FIG. 15 is a diagram illustrating an example of a manufacturing method of the semiconductor device 100 described in FIGS. 1 to 14.

FIG. 15 is a diagram illustrating an example of a manufacturing method of the semiconductor device 100 described in FIGS. 1 to 14. The manufacturing method includes a hydrogen implantation step which includes an upper surface implantation step of implanting hydrogen ions from the upper surface 21 of the semiconductor substrate 10 to a first depth position and a lower surface implantation step of implanting hydrogen ions from the lower surface 23 of the semiconductor substrate to a second depth position different from the first depth position. In FIG. 15, the lower surface implantation step is the stage S1408. In FIG. 15, the upper surface implantation step is any one of the stages S1412, S1413, S1414, and S1415. The first depth position is one of the depth positions Z1 and Z2, and the second depth position is the other one of the depth positions Z1 and Z2.

In this example, in the stage S1400, the upper surface structure of the semiconductor device 100 is formed. The upper surface structure refers to a structure provided on the upper surface 21 side of the semiconductor substrate 10, and includes, for example, the trench portion, the emitter region 12, the base region 14, the accumulation region 16, the interlayer dielectric film 38, the emitter electrode 52, the gate runner, and the like.

Next, in the stage S1402, the lower surface 23 side of the semiconductor substrate 10 is ground to adjust the thickness of the semiconductor substrate 10. Next, in the stage S1412, hydrogen ions may be implanted from the upper surface 21 side of the semiconductor substrate 10. However, the implantation of hydrogen ions from the upper surface 21 side may be performed at another timing to be described later. In the stage S1412, hydrogen ions are implanted into one of the depth position Z1 and the depth position Z2. The depth position Z2 may be disposed between the depth position Z1 and the lower surface 23.

In the examples of FIGS. 1 to 8, in the stage S1412, hydrogen ions are implanted from the upper surface 21 to the depth position Z2. In the examples of FIGS. 12 to 14, hydrogen ions are implanted from the upper surface 21 to the depth position Z1 in the stage S1412.

Next, in the stage S1404, a P type dopant is implanted into the collector region 22. In the stage S1404, an N type dopant may also be implanted into the cathode region 82. Next, in the stage S1413, hydrogen ions may be implanted from the upper surface 21 side of the semiconductor substrate 10. The stage S1413 is similar to the stage S1412. When performing the stage S1413, the stage S1412 may not be performed.

Next, in the stage S1406, the region near the lower surface 23 is irradiated with a laser to perform laser annealing. Thus, the cathode region 82 and the collector region 22 are formed. If the stage S1412 or the stage S1413 is performed before the stage S1406, excessive defects formed by hydrogen ion implantation may be recovered by laser annealing in the stage S1406. In particular, in the stage S1412 or the stage S1413, when hydrogen ions are implanted into the region on the lower surface 23 side from the upper surface 21, the acceleration energy of the hydrogen ions increases, so that excessive defects are likely to be formed. In this case, the excessive defects in the vicinity of the lower surface 23 can be recovered by the stage S1406.

Next, in the stage S1414, hydrogen ions may be implanted from the upper surface 21 side of the semiconductor substrate 10. The stage S1414 is similar to the stage S1412. When performing the stage S1414, the stage S1412 and the stage S1413 may not be performed. Next, in the stage S1408, hydrogen ions are implanted from the lower surface 23 side. In the stage S1408, hydrogen ions are implanted into one of the depth position Z1 and the depth position Z2 from the lower surface 23. As described above, the depth position at which hydrogen ions are implanted from the upper surface 21 side is different from the depth position at which hydrogen ions are implanted from the lower surface 23 side.

In the example of FIGS. 1 to 8, in the stage S1408, hydrogen ions are implanted from the lower surface 23 to the depth position Z1. In the examples of FIGS. 12 to 14, hydrogen ions are implanted from the lower surface 23 to the depth position Z2 in the stage S1408.

Next, in the stage S1415, hydrogen ions may be implanted from the upper surface 21 side of the semiconductor substrate 10. The stage S1415 is similar to the stage S1412. When performing the stage S1415, the stage S1412, the stage S1413, and the stage S1414 may not be performed. By performing the stage S1414 or the stage S1415 after the stage S1406, it is possible to suppress excessive recovery of vacancy defects near the lower surface 23 formed in the stage 1414 or the stage S1415 by laser annealing. Therefore, the donor concentration of the semiconductor substrate 10 can be accurately controlled.

Next, in the stage S1410, the semiconductor substrate 10 is heat-treated. In the stage S1410, the entire semiconductor substrate 10 may be heat-treated by an annealing furnace. As a result, hydrogen is diffused to promote the formation of VOH defects. The heat treatment temperature in the stage S1410 may be 350° C. or more and 380° C. or less. The upper limit of the heat treatment temperature may be 360° C. or lower. After the stage S1410, a structure such as the collector electrode 24 is formed. Thus, the semiconductor device 100 can be manufactured.

The heat treatment step shown in the stage S1410 may be performed twice after hydrogen is implanted from one of the upper surface 21 and the lower surface 23 and after hydrogen is implanted from the other one of the upper surface 21 and the lower surface 23. In addition, the step of implanting hydrogen from the upper surface 21 and the step of implanting hydrogen from the lower surface 23 may be performed first when the acceleration energy of hydrogen is higher. Also in this case, heat treatment may be performed every time hydrogen implantation is performed. More specifically, the temperature of the first heat treatment step after performing the hydrogen implantation step with higher acceleration energy may be higher than the temperature of the second heat treatment step after performing the hydrogen implantation step with lower acceleration energy. The temperature of the first heat treatment step may range from 360° C. or more and 380° C. or less. The temperature in the second heat treatment step may be lower than 360° C. When the acceleration energy is higher, vacancy defects are more likely to be formed, and thus VOH defects can be efficiently formed by increasing the heat treatment temperature in the first heat treatment step.

Although the present invention has been described using the embodiments, the technical scope of the present invention is not limited to the scope described in the above embodiments. It is apparent to those skilled in the art that various modifications or improvements can be made to the above embodiments. It is apparent from the description of the claims that modes to which such changes or improvements are added can also be included in the technical scope of the present invention.

It should be noted that the order of execution of each processing such as operations, procedures, steps, and stages in the devices, systems, programs, and methods illustrated in the claims, the specification, and the drawings can be realized in any order unless "before", "prior to", or the like is specifically stated, and unless the output of the previous processing is used in the later processing. Even if the operation flow in the claims, the specification, and the drawings is described using "First", "Next", and the like for convenience, it does not mean that it is essential to perform in this order.

EXPLANATION OF REFERENCES

10: semiconductor substrate
11: well region
12: emitter region
14: base region
15: contact region
16: accumulation region
18: drift region
20: buffer region
21: upper surface
22: collector region
23: lower surface
24: collector electrode
25: peak
29: linear portion
30: dummy trench portion
31: edge portion
32: dummy insulating film
34: dummy conductive portion
38: interlayer dielectric film
39: linear portion
40: gate trench portion
41: edge portion
42: gate insulating film
44: gate conductive portion
52: emitter electrode
54: contact hole
60, 61: mesa portion
70: transistor portion
80: diode portion
81: extension region
82: cathode region
90: edge termination structure portion
100: semiconductor device
101 first hydrogen concentration peak
102: second hydrogen concentration peak
103: intermediate hydrogen distribution
104: upper surface side hydrogen distribution
105: lower surface side hydrogen distribution
106: pass-through region
111: first donor concentration peak
112: second donor concentration peak
113: intermediate donor distribution
114: upper surface side donor distribution
115: lower surface side donor distribution
130: outer peripheral gate runner
131: active-side gate runner
150: flat portion
160: active portion
162: edge
164: gate pad

What is claimed is:

1. A semiconductor device comprising:
a semiconductor substrate that has an upper surface and a lower surface,
wherein a hydrogen chemical concentration distribution of the semiconductor substrate in a depth direction has a first hydrogen concentration peak and a second hydrogen concentration peak disposed closer to the lower surface side of the semiconductor substrate than the first hydrogen concentration peak, and
wherein an intermediate donor concentration between the first hydrogen concentration peak and the second hydrogen concentration peak is different from any of an upper surface side donor concentration between the first hydrogen concentration peak and the upper surface of the semiconductor substrate and a lower surface side donor concentration between the second hydrogen concentration peak and the lower surface of the semiconductor substrate.

2. The semiconductor device according to claim 1, wherein the intermediate donor concentration is higher than any of the upper surface side donor concentration and the lower surface side donor concentration.

3. The semiconductor device according to claim 2, wherein an intermediate hydrogen concentration between the first hydrogen concentration peak and the second hydrogen concentration peak is higher than any of an upper surface side hydrogen concentration between the first hydrogen concentration peak and the upper surface of the semiconductor substrate and a lower surface side hydrogen concentration between the second hydrogen concentration peak and the lower surface of the semiconductor substrate.

4. The semiconductor device according to claim 3, wherein the intermediate hydrogen concentration is 10 times or more the intermediate donor concentration.

5. The semiconductor device according to claim 2, wherein the intermediate donor concentration is $1 \times 10^{13}/cm^3$ or more and $1 \times 10^{15}/cm^3$ or less.

6. The semiconductor device according to claim 2, wherein the intermediate donor concentration is 1.5 times or more each of the upper surface side donor concentration and the lower surface side donor concentration.

7. The semiconductor device according to claim 2, wherein the hydrogen chemical concentration distribution includes:
a first upper surface side skirt in which a hydrogen concentration decreases from the first hydrogen concentration peak toward the upper surface side;
a first lower surface side skirt in which a hydrogen concentration more gradually decreases from the first hydrogen concentration peak toward the lower surface side than the first upper surface side skirt;
a second lower surface side skirt in which a hydrogen concentration decreases from the second hydrogen concentration peak toward the lower surface side; and
a second upper surface side skirt in which a hydrogen concentration more gradually decreases from the second hydrogen concentration peak toward the upper surface side than the second lower surface side skirt.

8. The semiconductor device according to claim 2, wherein the first hydrogen concentration peak is higher than the second hydrogen concentration peak, and
wherein the lower surface side donor concentration is higher than the upper surface side donor concentration.

9. The semiconductor device according to claim 2, wherein the second hydrogen concentration peak is higher than the first hydrogen concentration peak, and wherein the upper surface side donor concentration is higher than the lower surface side donor concentration.

10. The semiconductor device according to claim 2,
wherein the first hydrogen concentration peak is disposed between a center of a region on the upper surface side in a depth direction and the upper surface, and
wherein the second hydrogen concentration peak is disposed between a center of a region on the lower surface side in a depth direction and the lower surface.

11. The semiconductor device according to claim 1,
wherein the semiconductor substrate includes:
a drift region of a first conductivity type;
a trench portion provided on the upper surface of the semiconductor substrate; and
a buffer region of the first conductivity type that is provided between the drift region and the lower surface of the semiconductor substrate and has a higher concentration than the drift region,
wherein the first hydrogen concentration peak and the second hydrogen concentration peak are disposed between a lower end of the trench portion and an upper end of the buffer region in the depth direction, and
wherein an intermediate donor concentration between the first hydrogen concentration peak and the second hydrogen concentration peak is lower than any of an upper surface side donor concentration between the first hydrogen concentration peak and the upper surface of the semiconductor substrate and a lower surface side donor concentration between the second hydrogen concentration peak and the lower surface of the semiconductor substrate.

12. The semiconductor device according to claim 11,
wherein both the first hydrogen concentration peak and the second hydrogen concentration peak are disposed between a center of the semiconductor substrate in the depth direction and the upper surface.

13. The semiconductor device according to claim 1,
wherein both the lower surface side donor concentration and the upper surface side donor concentration are higher than a bulk donor concentration of the semiconductor substrate.

14. The semiconductor device according to claim 1,
wherein a donor concentration distribution of the semiconductor substrate in a depth direction has a flat portion both between the first hydrogen concentration peak and the upper surface of the semiconductor substrate and between the second hydrogen concentration peak and the lower surface of the semiconductor substrate.

15. The semiconductor device according to claim 1,
wherein a donor concentration distribution of the semiconductor substrate in a depth direction has a flat portion between the first hydrogen concentration peak and the second hydrogen concentration peak.

16. The semiconductor device according to claim 1,
wherein a distance between the first hydrogen concentration peak and the second hydrogen concentration peak in the depth direction is ½ or less of a thickness of the semiconductor substrate in the depth direction.

17. A manufacturing method of a semiconductor device, comprising:
implanting hydrogen ions from one of an upper surface and a lower surface of a semiconductor substrate to a first depth position, and implanting hydrogen ions from the other one of the upper surface and the lower surface of the semiconductor substrate to a second depth position different from the first depth position; and
performing heat treatment on the semiconductor substrate, wherein
the second depth position is disposed between the first depth position and the other one of the upper surface and the lower surface,
wherein the semiconductor substrate includes a drift region of a first conductivity type, a trench portion provided in the upper surface of the semiconductor substrate, and a buffer region of the first conductivity type provided between the drift region and the lower surface of the semiconductor substrate and having a higher concentration than the drift region, and
wherein the first depth position and the second depth position are disposed between a lower end of the trench portion and an upper end of the buffer region in a depth direction of the semiconductor substrate.

18. The manufacturing method of the semiconductor device according to claim 17, comprising:
performing laser annealing on at least one of the upper surface and the lower surface of the semiconductor substrate,
wherein the hydrogen implanting is performed after the laser annealing.

19. A manufacturing method of a semiconductor device, comprising:
implanting hydrogen ions from one surface among an upper surface and a lower surface of a semiconductor substrate to a first depth position, and implanting hydrogen ions from an other surface among the upper surface and the lower surface of the semiconductor substrate to a second depth position different from the first depth position; and
performing heat treatment on the semiconductor substrate,
wherein the second depth position is disposed between the first depth position and the one surface so that an overlapped implanted region is formed.

* * * * *